US011876139B2

(12) United States Patent
Zhou et al.

(10) Patent No.: US 11,876,139 B2
(45) Date of Patent: *Jan. 16, 2024

(54) METHODS OF FORMING A COLORED CONDUCTIVE RIBBON FOR INTEGRATION IN A SOLAR MODULE

(71) Applicant: The Solaria Corporation, Fremont, CA (US)

(72) Inventors: Lisong Zhou, Fremont, CA (US); Huaming Zhou, Wuxi (CN); Zhixun Zhang, Wuxi (CN)

(73) Assignee: SOLARCA LLC, San Ramon, CA (US)

( * ) Notice: Subject to any disclaimer, the term of this patent is extended or adjusted under 35 U.S.C. 154(b) by 237 days.

This patent is subject to a terminal disclaimer.

(21) Appl. No.: 17/369,753

(22) Filed: Jul. 7, 2021

(65) Prior Publication Data

US 2021/0336070 A1    Oct. 28, 2021

Related U.S. Application Data

(63) Continuation of application No. 16/411,002, filed on May 13, 2019, now Pat. No. 11,088,292.

(30) Foreign Application Priority Data

Oct. 31, 2018 (CN) .......................... 201811140595.5

(51) Int. Cl.
*H01L 31/0216* (2014.01)
*H01L 31/0463* (2014.01)
(Continued)

(52) U.S. Cl.
CPC .. *H01L 31/02168* (2013.01); *H01L 31/02002* (2013.01); *H01L 31/02366* (2013.01);
(Continued)

(58) Field of Classification Search
CPC ............. H01L 31/02168; H01L 31/036; H01L 31/0463; H01L 31/02002; H01L 31/02366;
(Continued)

(56) References Cited

U.S. PATENT DOCUMENTS 3,340,096 A    9/1967  Mann et al.
3,769,091 A    10/1973  Leinkram et al.
(Continued)

FOREIGN PATENT DOCUMENTS

CN    202977481 U    6/2013
CN    103341703 A    10/2013
(Continued)

OTHER PUBLICATIONS

Search Report and Written Opinion dated Nov. 21, 2019 for European Application No. 19169922.2.
(Continued)

*Primary Examiner* — Sitaramarao S Yechuri

(57) ABSTRACT

The present disclosure describes methods of forming a colored conductive ribbon for a solar module which includes combining a conductive ribbon with a channeled ribbon holder, applying a color coating to at least the conductive ribbon within the channel, curing the color coating on the conductive ribbon, and separating the conductive ribbon from the channeled holder.

19 Claims, 14 Drawing Sheets

(51) Int. Cl.
  *H01L 31/02*    (2006.01)
  *H01L 31/0236*  (2006.01)
  *H01L 31/18*    (2006.01)
  *H01L 31/036*   (2006.01)
  *H01L 31/05*    (2014.01)

(52) U.S. Cl.
  CPC ........ *H01L 31/036* (2013.01); *H01L 31/0463* (2014.12); *H01L 31/0512* (2013.01); *H01L 31/18* (2013.01); *H01L 2221/1068* (2013.01)

(58) Field of Classification Search
  CPC . H01L 31/18; H01L 31/0512; H01L 31/0504; H01L 2221/1068; Y02E 10/50
  See application file for complete search history.

(56) References Cited

U.S. PATENT DOCUMENTS

| | | | |
|---|---|---|---|
| 3,811,181 A | 5/1974 | Leinkram et al. | |
| 3,837,924 A | 9/1974 | Baron | |
| 4,040,867 A | 8/1977 | Forestieri et al. | |
| 4,617,421 A | 10/1986 | Nath et al. | |
| 4,877,460 A | 10/1989 | Flodl | |
| 5,096,505 A | 3/1992 | Fraas et al. | |
| 5,547,516 A | 8/1996 | Luch | |
| 5,575,861 A | 11/1996 | Younan et al. | |
| 5,665,274 A * | 9/1997 | Long | C09D 183/04 252/511 |
| 5,735,966 A | 4/1998 | Luch | |
| 6,232,545 B1 | 5/2001 | Samaras et al. | |
| 6,327,994 B1 * | 12/2001 | Labrador | B63B 39/06 114/382 |
| 6,414,235 B1 | 7/2002 | Luch | |
| 6,459,032 B1 | 10/2002 | Luch | |
| D524,727 S | 7/2006 | Yamashita et al. | |
| D543,501 S | 5/2007 | Yamashita et al. | |
| 7,732,243 B2 | 6/2010 | Luch | |
| 7,740,497 B2 | 6/2010 | Nightingale | |
| 7,898,053 B2 | 3/2011 | Luch | |
| 7,898,054 B2 | 3/2011 | Luch | |
| 7,989,692 B2 | 8/2011 | Luch | |
| 7,989,693 B2 | 8/2011 | Luch | |
| 8,007,306 B2 | 8/2011 | Nightingale et al. | |
| D644,986 S | 9/2011 | Ross et al. | |
| D644,987 S | 9/2011 | Casler et al. | |
| 8,033,857 B2 | 10/2011 | Nightingale et al. | |
| D662,042 S | 6/2012 | Yeh | |
| 8,198,696 B2 | 6/2012 | Luch | |
| 8,242,351 B2 | 8/2012 | Gibson et al. | |
| D679,650 S | 4/2013 | Farris, III et al. | |
| 8,563,848 B1 | 10/2013 | Wen et al. | |
| D694,175 S | 11/2013 | Kannou et al. | |
| D699,176 S | 2/2014 | Salomon et al. | |
| D719,909 S | 12/2014 | Iwasaki et al. | |
| D741,793 S | 10/2015 | Lim | |
| 9,219,174 B2 | 12/2015 | Heng et al. | |
| D762,163 S | 7/2016 | Parilla et al. | |
| D763,787 S | 8/2016 | Parilla et al. | |
| 9,412,884 B2 | 8/2016 | Heng et al. | |
| D767,484 S | 9/2016 | Morad et al. | |
| D781,230 S | 3/2017 | Gibson et al. | |
| D784,254 S | 4/2017 | Parilla et al. | |
| D788,027 S | 5/2017 | Gibson et al. | |
| D812,554 S | 3/2018 | Gibson et al. | |
| D813,153 S | 3/2018 | Gibson et al. | |
| 9,935,221 B1 | 4/2018 | Zhou et al. | |
| 9,935,222 B1 | 4/2018 | Zhou et al. | |
| 2003/0121228 A1 | 7/2003 | Stoehr et al. | |
| 2004/0248421 A1 * | 12/2004 | Yorita | H01L 21/4821 438/719 |
| 2007/0235077 A1 | 10/2007 | Nagata et al. | |
| 2008/0011350 A1 | 1/2008 | Luch | |
| 2008/0043431 A1 * | 2/2008 | Marotta | H01L 23/467 361/689 |
| 2008/0216887 A1 | 9/2008 | Hacke et al. | |
| 2008/0314433 A1 | 12/2008 | Luch | |
| 2009/0107538 A1 | 4/2009 | Luch | |
| 2009/0120484 A1 | 5/2009 | Nightingale | |
| 2009/0293941 A1 | 12/2009 | Luch | |
| 2010/0024881 A1 | 2/2010 | Hacke et al. | |
| 2010/0078058 A1 | 4/2010 | Nightingale et al. | |
| 2010/0108118 A1 | 5/2010 | Luch | |
| 2010/0175743 A1 | 7/2010 | Gonzalez et al. | |
| 2011/0067754 A1 | 3/2011 | Luch | |
| 2011/0126878 A1 | 6/2011 | Hacke et al. | |
| 2011/0168238 A1 | 7/2011 | Metin et al. | |
| 2011/0186104 A1 | 8/2011 | Shugar et al. | |
| 2011/0186107 A1 | 8/2011 | Gibson et al. | |
| 2011/0197947 A1 | 8/2011 | Croft | |
| 2011/0240096 A1 | 10/2011 | Maheshwari | |
| 2011/0315196 A1 | 12/2011 | Gibson et al. | |
| 2012/0031461 A1 | 2/2012 | Luch | |
| 2012/0125391 A1 | 5/2012 | Pinarbasi et al. | |
| 2012/0167945 A1 | 7/2012 | Shugar et al. | |
| 2012/0167946 A1 | 7/2012 | Maheshwari et al. | |
| 2012/0167947 A1 | 7/2012 | Battaglia, Jr. et al. | |
| 2012/0167948 A1 | 7/2012 | Marathe et al. | |
| 2012/0171802 A1 | 7/2012 | Luch et al. | |
| 2012/0204938 A1 | 8/2012 | Hacke et al. | |
| 2012/0211052 A1 | 8/2012 | Marathe et al. | |
| 2012/0318318 A1 | 12/2012 | Metin et al. | |
| 2012/0318319 A1 | 12/2012 | Pinarbasi et al. | |
| 2012/0325282 A1 | 12/2012 | Snow et al. | |
| 2013/0032194 A1 | 2/2013 | Gibson et al. | |
| 2013/0061920 A1 | 3/2013 | Balucani | |
| 2013/0068827 A1 | 3/2013 | Akimoto | |
| 2014/0102502 A1 | 4/2014 | Luch et al. | |
| 2014/0318613 A1 | 10/2014 | Von Campe et al. | |
| 2015/0090314 A1 | 4/2015 | Yang et al. | |
| 2015/0249177 A1 | 9/2015 | Ishii et al. | |
| 2015/0349145 A1 | 12/2015 | Morad et al. | |
| 2016/0020342 A1 | 1/2016 | Heng et al. | |
| 2016/0118515 A1 | 4/2016 | Mori et al. | |
| 2016/0158890 A1 | 6/2016 | Gonzalez et al. | |
| 2016/0163914 A1 | 6/2016 | Gonzalez et al. | |
| 2016/0172515 A1 | 6/2016 | Shugar et al. | |
| 2016/0226438 A1 | 8/2016 | Gibson et al. | |
| 2016/0226439 A1 | 8/2016 | Gibson | |
| 2016/0233352 A1 | 8/2016 | Yang et al. | |
| 2017/0243992 A1 | 8/2017 | Rostan et al. | |
| 2017/0301802 A1 | 10/2017 | Gibson | |
| 2017/0301821 A1 | 10/2017 | Gibson et al. | |
| 2017/0301822 A1 | 10/2017 | Gibson et al. | |
| 2017/0336105 A1 | 11/2017 | Au | |
| 2019/0044001 A1 | 2/2019 | Koizumi et al. | |
| 2019/0237592 A1 | 8/2019 | Gibson et al. | |
| 2019/0237604 A1 | 8/2019 | Detrick et al. | |
| 2019/0288143 A1 | 9/2019 | Taira et al. | |
| 2019/0319147 A1 | 10/2019 | Detrick et al. | |
| 2020/0013913 A1 * | 1/2020 | Chari | H01L 31/022433 |

FOREIGN PATENT DOCUMENTS

| | | |
|---|---|---|
| CN | 203242643 U | 10/2013 |
| CN | 203445139 U | 2/2014 |
| CN | 104201227 A | 12/2014 |
| CN | 104810412 A | 7/2015 |
| CN | 105304766 A | 2/2016 |
| CN | 205609546 U | 9/2016 |
| CN | 205609547 U | 9/2016 |
| CN | 205609548 U | 9/2016 |
| CN | 107068795 A | 8/2017 |
| CN | 107418318 A | 12/2017 |
| CN | 209150132 U | 7/2019 |
| DE | 102010004112 A1 | 12/2010 |
| EP | 2455512 A1 | 5/2012 |
| EP | 2743005 A1 | 6/2014 |
| ES | 1073379 U | 12/2010 |
| JP | H11261095 A | 9/1999 |
| JP | D1310216 | 9/2007 |
| JP | 2013012679 A | 1/2013 |
| JP | 2013140841 A | 7/2013 |
| JP | D1495792 | 4/2014 |

(56) References Cited

FOREIGN PATENT DOCUMENTS

| | | |
|---|---|---|
| JP | 2014110254 A | 6/2014 |
| JP | 2017077167 A | 4/2017 |
| JP | 2017098503 A | 6/2017 |
| JP | 2018063542 A | 4/2018 |
| KR | 3005917880000 | 3/2011 |
| KR | 20160094396 A | 8/2016 |
| KR | 008761570002 | 10/2016 |
| KR | 3008761570001 | 10/2016 |
| KR | 3008761570003 | 10/2016 |
| KR | 3008761570004 | 10/2016 |
| WO | WO2012091781 A1 | 5/2012 |
| WO | WO2012091782 A1 | 7/2012 |
| WO | WO2012106003 A1 | 8/2012 |
| WO | WO2014112424 A1 | 7/2014 |
| WO | WO2016123559 A1 | 8/2016 |
| WO | WO2017179523 A1 | 10/2017 |
| WO | WO2018055863 A1 | 3/2018 |
| WO | WO2018116899 A1 | 6/2018 |

OTHER PUBLICATIONS

Office Action dated Jul. 7, 2020 for Japanese Application 2019-075234.

\* cited by examiner

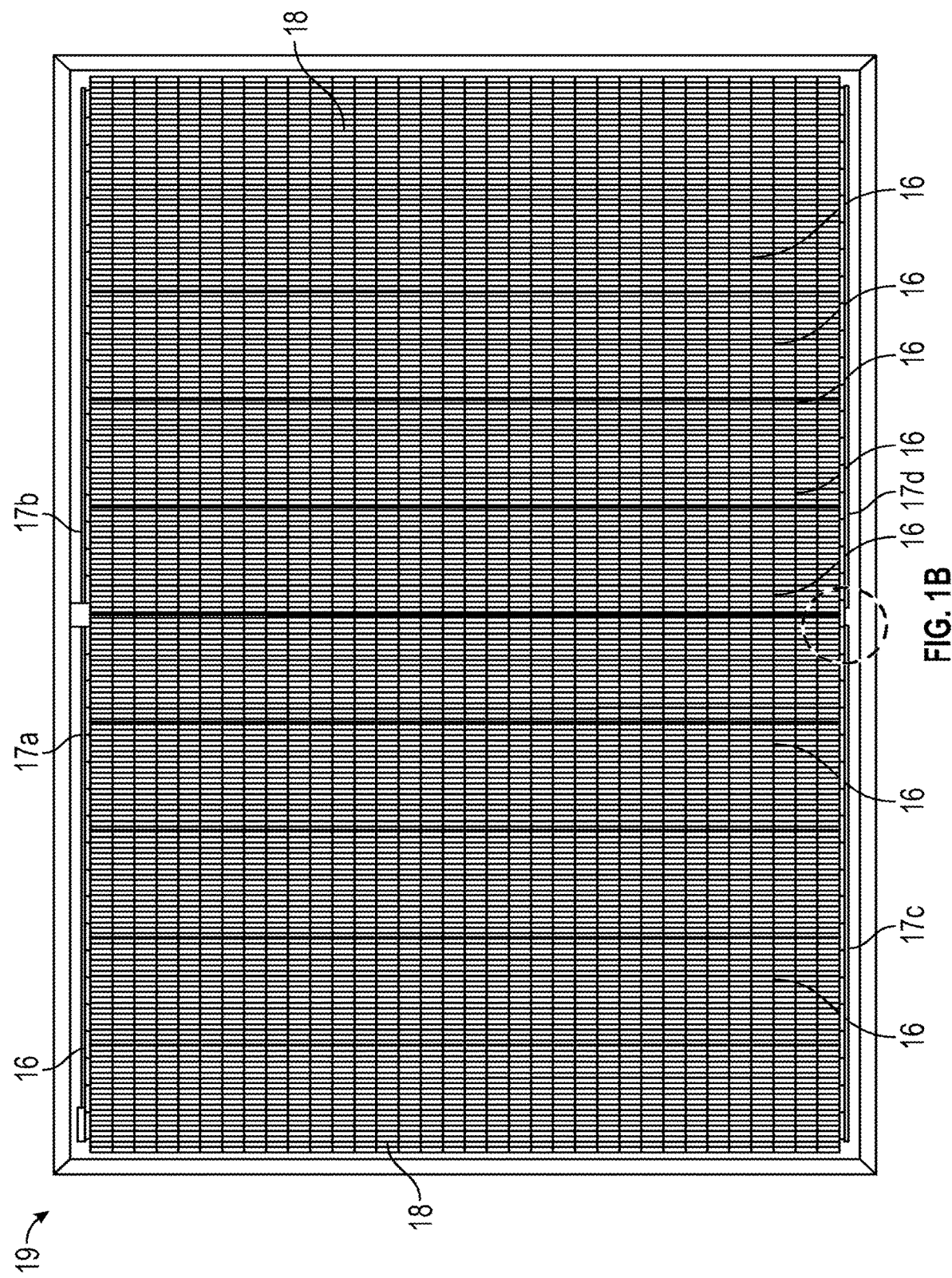

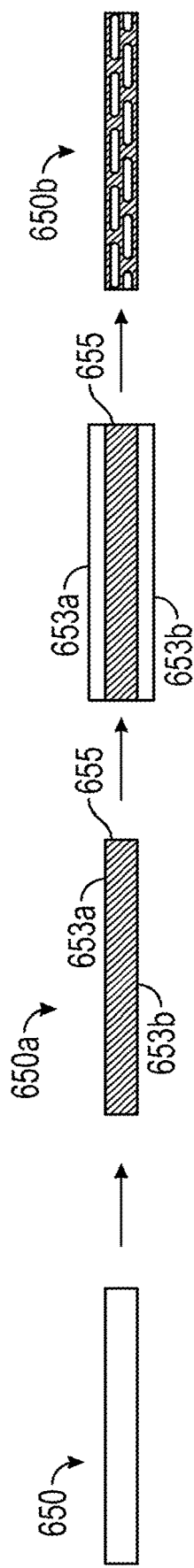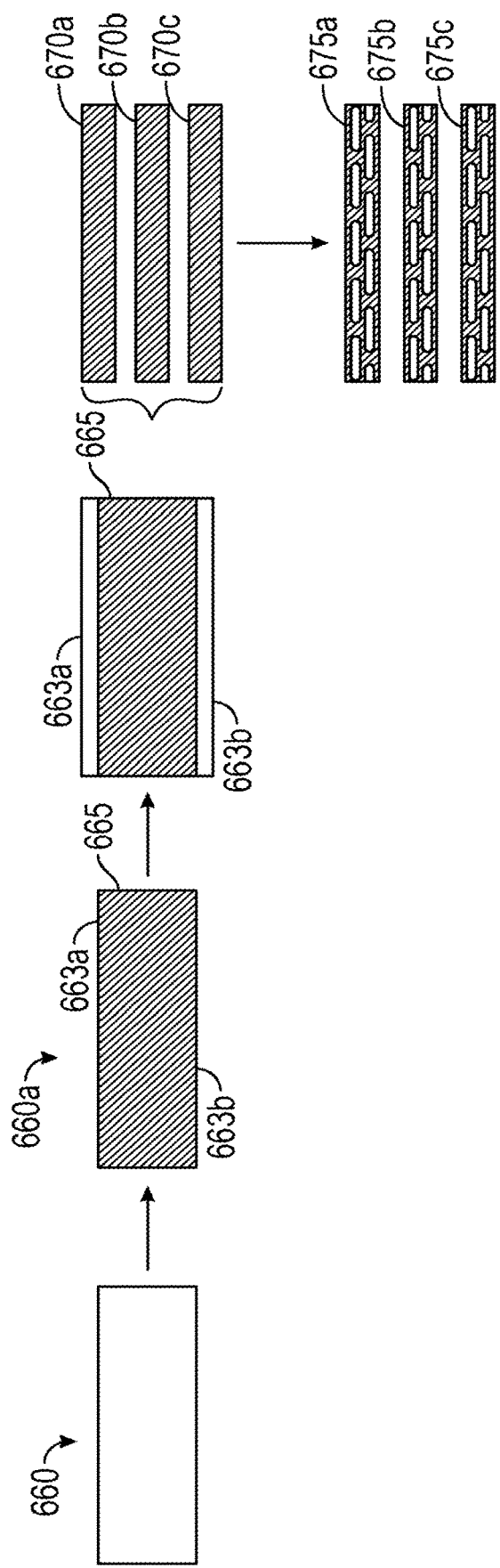
FIG. 9A
FIG. 9B

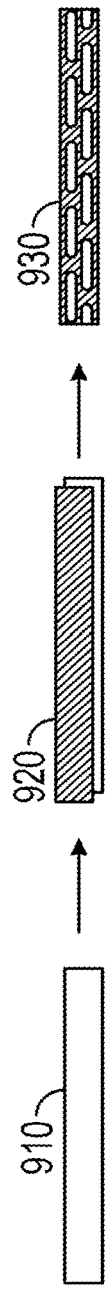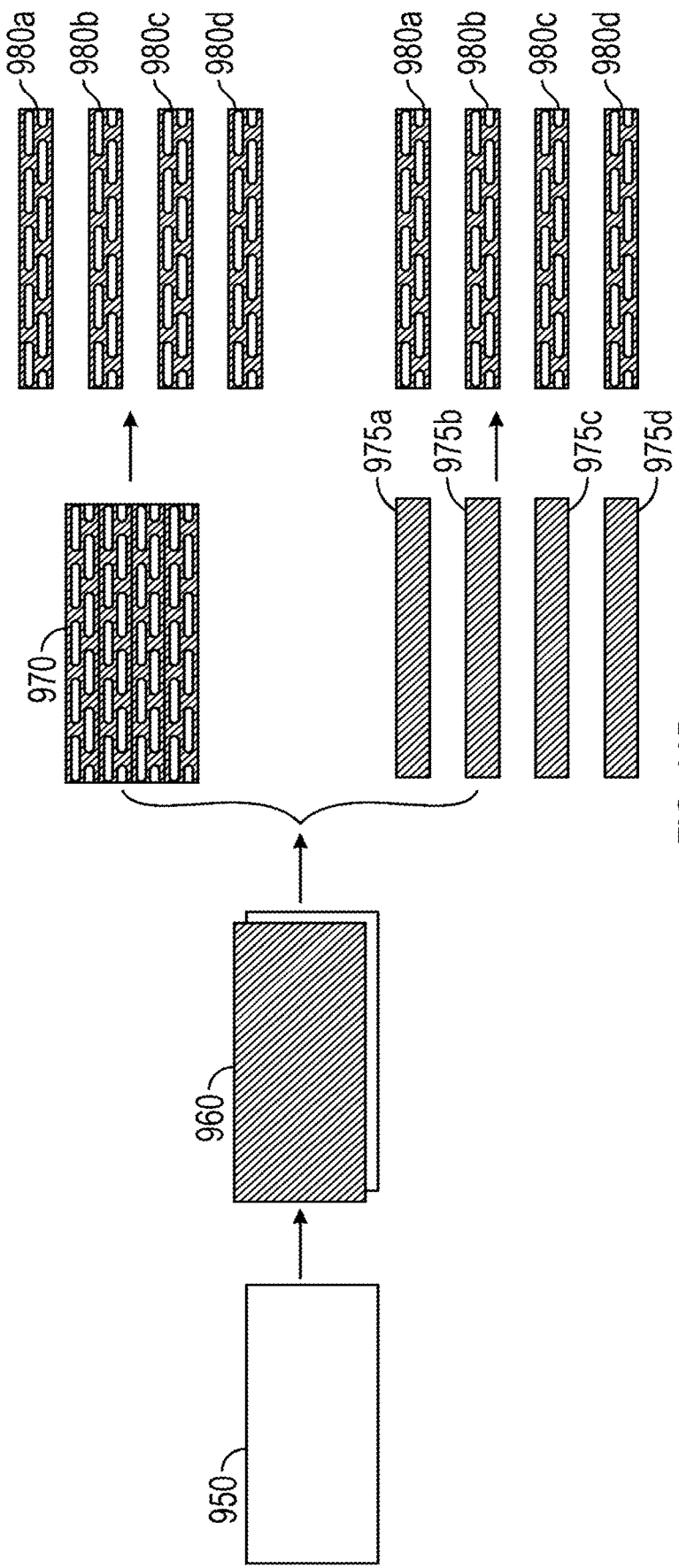

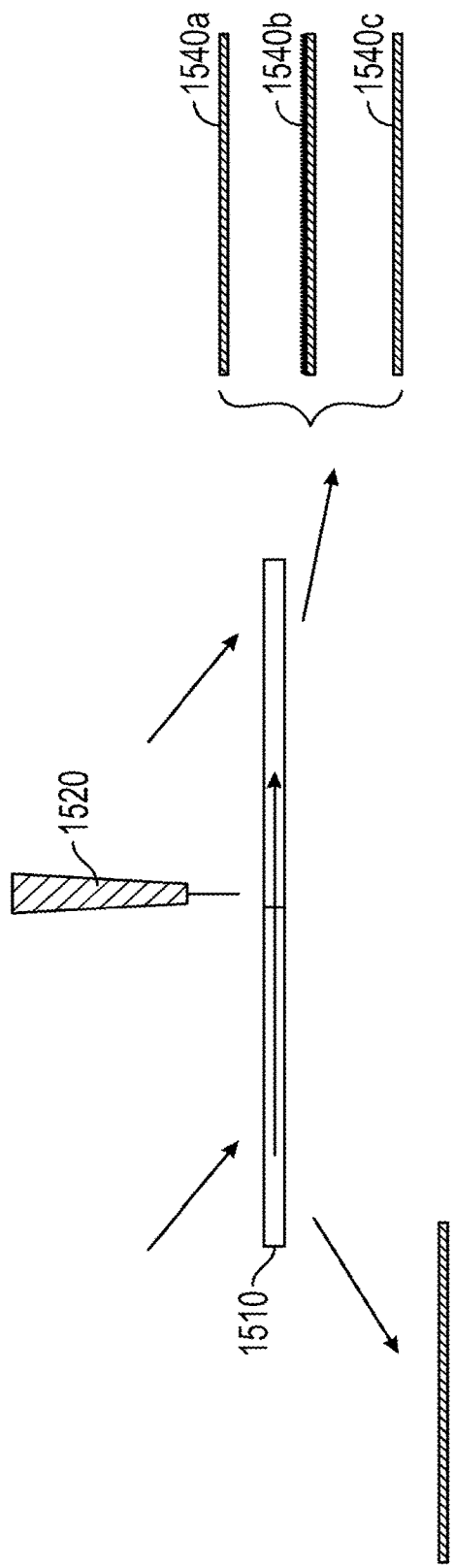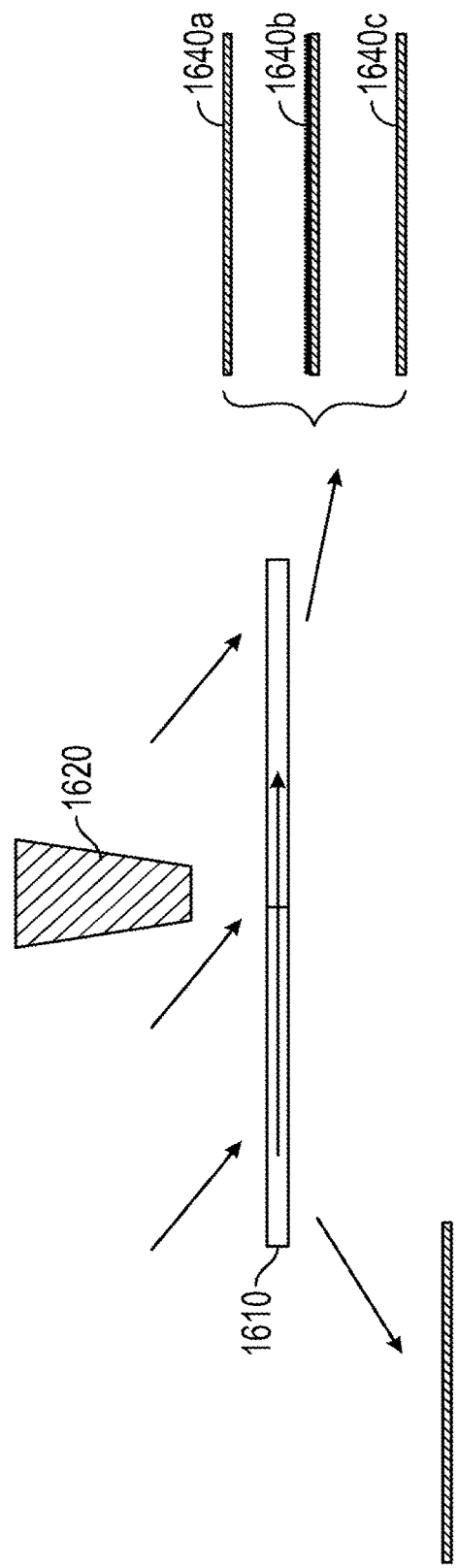

METHODS OF FORMING A COLORED CONDUCTIVE RIBBON FOR INTEGRATION IN A SOLAR MODULE

CROSS-REFERENCES TO RELATED APPLICATIONS

This application is a continuation of and claims priority to U.S. application Ser. No. 16/411,002 filed May 13, 2019, which claims priority to CN Patent Application No. 201811140595.5 filed Oct. 31, 2018, which are hereby incorporated by reference in their entirety

TECHNICAL FIELD

The present disclosure relates to solar modules, and more particularly, to solar modules including improved efficiency and aesthetics by including colored electrically conductive ribbons, or other materials that can be attached directly to the solar cells and/or solar modules, which can be formed from the methods described herein.

BACKGROUND

Over the past few years, the use of fossil fuels as an energy source has been trending downward. Many factors have contributed to this trend. For example, it has long been recognized that the use of fossil fuel-based energy options, such as oil, coal, and natural gas, produces gases and pollution that may not be easily removed from the atmosphere. Additionally, as more fossil fuel-based energy is consumed, more pollution is discharged into the atmosphere causing harmful effects on life close by. Despite these effects, fossil-fuel based energy options are still being depleted at a rapid pace and, as a result, the costs of some of these fossil fuel resources, such as oil, have risen. Further, as many of the fossil fuel reserves are located in politically unstable areas, the supply and costs of fossil fuels have been unpredictable.

Due in part to the many challenges presented by these traditional energy sources, the demand for alternative, clean energy sources has increased dramatically. To further encourage solar energy and other clean energy usage, some governments have provided incentives, in the form of monetary rebates or tax relief, to consumers willing to switch from traditional energy sources to clean energy sources. In other instances, consumers have found that the long-term savings benefits of changing to clean energy sources have outweighed the relatively high upfront cost of implementing clean energy sources.

One form of clean energy, solar energy, has risen in popularity over the past few years. Advancements in semi-conductor technology have allowed the designs of solar modules and solar panels to be more efficient and capable of greater output. Further, the materials for manufacturing solar modules and solar panels have become relatively inexpensive, which has contributed to the decrease in costs of solar energy. As solar energy has increasingly become an affordable clean energy option for individual consumers, solar module and panel manufacturers have made available products with aesthetic and utilitarian appeal for implementation on residential structures. As a result of these benefits, solar energy has gained widespread global popularity.

SUMMARY

The present disclosure provides solar modules and/or solar cells including electrically conductive ribbons which are color-coated on at least one side. In addition, methods of manufacturing such color-coated electrically conductive ribbons, or other materials that ma attached directly thereto, are also provided.

In embodiments, methods of forming a colored conductive ribbon for a solar module are provided which include the steps of: a) providing a ribbon holder including a channel configured to receive a conductive ribbon therein, b) securing the conductive ribbon in the channel of the ribbon holder, c) applying a color coating to at least the conductive ribbon secured within the channel, d) curing the color coating on the conductive ribbon, and e) separating the conductive ribbon from the channel of the ribbon holder.

In embodiments, the color coating may be a black composition or paint.

In embodiments, the color coating may be thermally insulative or electrically conductive.

In embodiments, the step of applying the color coating in c) may be performed by at least one method selected from screen-coating, roll-coating, or spray-coating.

In embodiments, the step of curing the color coating in d) may be performed by heat-curing or UV (ultraviolet light) curing.

In embodiments, the step of removing the conductive ribbon in e) may occur prior to the curing of the color coating in step d).

In embodiments, the ribbon may be secured in the channel by an adhesive positioned in the channel to temporarily fix the ribbon to the holder during the coating method provided herein. In such embodiments, the adhesive is configured to additionally remove contaminants from the bottom surface of the conductive ribbon when the conductive ribbon is separated from the temporary hold of the adhesive thereby releasing the ribbon from the channel and/or holder.

In embodiments, the ribbon may include pores, the pores may be added to the ribbon before or after the coating methods described herein. In embodiments, the pores may be formed by exposing the ribbons to a punching process.

In some embodiments, the methods described herein for forming a color conductive ribbon for a solar module include: a) securing a top surface of a base sheet, the top surface including an adhesive material, to a bottom surface of a masking sheet, b) forming a channel configured to receive a conductive ribbon in at least the masking sheet to form a ribbon holder, c) securing the conductive ribbon in the channel of the ribbon holder, d) applying a color coating to at least the conductive ribbon secured within the channel, e) curing the color coating on the conductive ribbon, and f) separating the conductive ribbon from the channel of the ribbon holder.

In still other embodiments, the methods described herein for forming a color conductive ribbon for a solar module include the steps of: a) securing a top surface of a masking sheet, the top surface including an first adhesive material, to a bottom surface of a handling sheet, b) securing a top surface of a base sheet, the top surface including an second adhesive material, to a bottom surface of the masking sheet, c) forming a channel configured to receive a conductive ribbon in at least the masking sheet to form a ribbon holder, d) securing the conductive ribbon in the channel of the ribbon holder, e) applying a color coating to at least the conductive ribbon secured within the channel, f) curing the color coating on the conductive ribbon, and g) separating the conductive ribbon from the channel of the ribbon holder.

BRIEF DESCRIPTION OF THE DRAWINGS

Various aspects of the present disclosure are described hereinbelow with reference to the drawings, which are incorporated in and constitute a part of this specification, wherein:

FIGS. 1A and 1B are top views of two types of solar modules including solar cells with electrically conductive ribbons;

FIGS. 9A and 9B are schematic views of methods of forming colored conductive ribbons using the ribbon holder of FIG. 4, as described in at least one embodiment herein;

FIGS. 11A and 11B are schematic views of methods of forming colored conductive ribbons as described in at least one embodiment herein;

FIGS. 13-16 are schematic cross-sectional side views of methods of roughening conductive ribbons as described in at least one embodiment herein.

DETAILED DESCRIPTION

Further details and aspects of exemplary embodiments of the present disclosure are described in more detail below with reference to the appended figures.

The present disclosure is directed to methods of forming solar modules and particularly solar modules formed from strips of solar cells that include additional materials attached thereto, such as electrically conductive ribbons, which are colored to improve the efficiency and/or aesthetics of the solar module and/or solar cell.

The solar cells of the present disclosure are used as the building block of solar modules. A solar cell is made up of a substrate configured to be capable of producing energy by converting light energy into electricity. Examples of suitable photovoltaic material include, but are not limited to, those made from multicrystalline or monocrystalline silicon wafers. These wafers may be processed through the major solar cell processing steps, which include wet or dry texturization, junction diffusion, silicate glass layer removal and edge isolation, silicon nitride anti-reflection layer coating, front and back metallization. The wafers may be further processed through advanced solar processing steps, including adding rear passivation coating and selective patterning to thereby obtain a passivated emitter rear contact (PERC) solar cell, which has a higher efficiency than solar cells formed using the standard process flow mentioned above. The solar cell may be a p-type monocrystalline cell or an n-type monocrystalline cell in other embodiments. Similar to the diffused junction solar cells described as above, other high efficiency solar cells, including heterojunction solar cells, can utilize the same metallization patterns in order to be used for the manufacture of a shingled array module. The solar cell may have a substantially square shape with chamfered corners (a pseudo-square) or a full square shape.

Figure 1A:
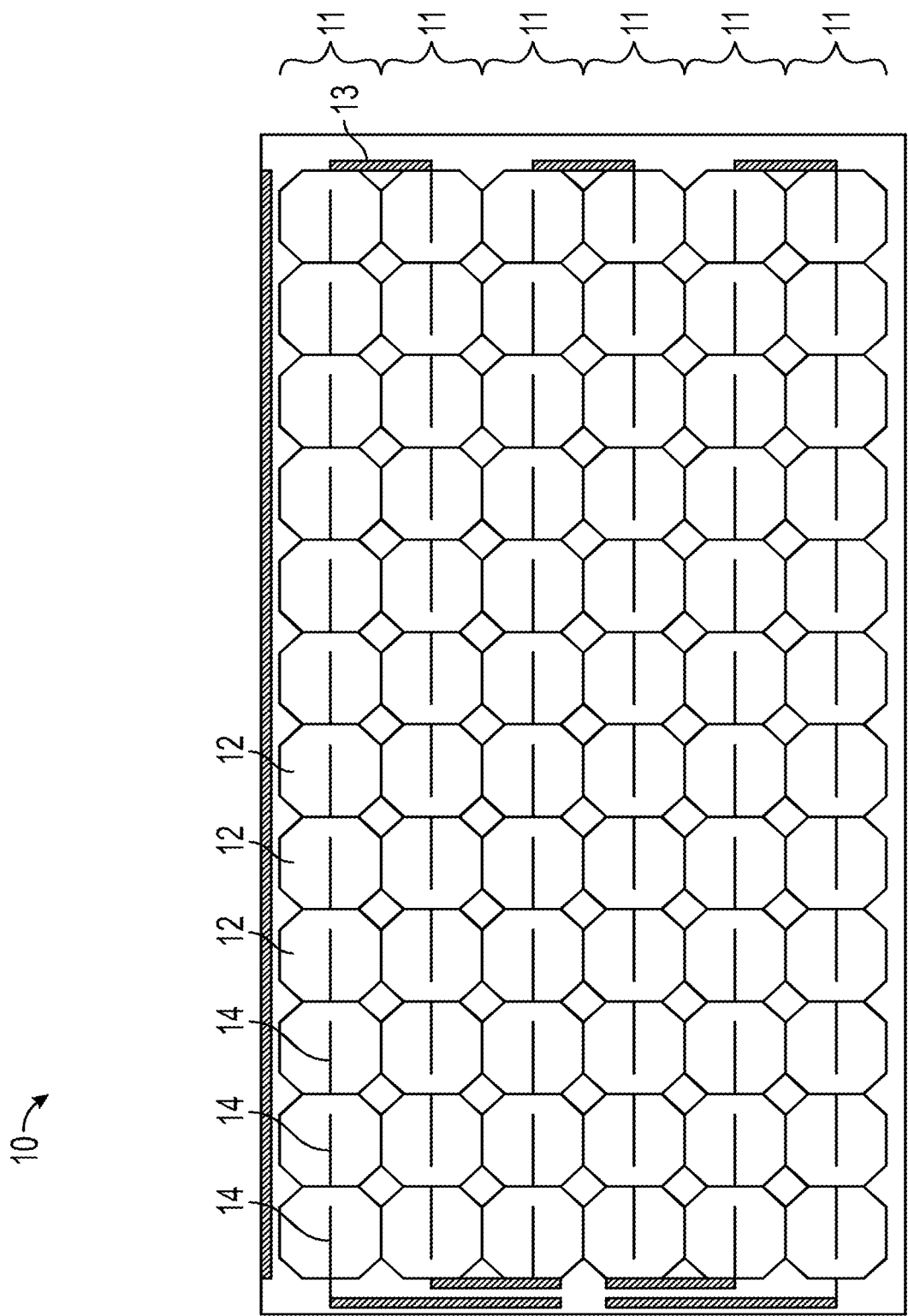

FIG. 1A depicts a top view of a first type of solar module 10 formed from strings 11 of solar cells 12, wherein the strings 11 are interconnected electrically via conductive bus ribbons 13. In addition, the solar cells 12 are interconnected electrically via conductive tab ribbons 14. The electrically conductive ribbons, such as bus ribbons 13 and tab ribbons 14, are designed to carry the electric output produced by the solar cells 12 from one solar cell to another neighboring solar cell and/or from one string 11 to another neighboring string. The electrically conductive ribbons, such as bus ribbons 13 and tab ribbons 14, can be fixed to the solar cells or solar module by any suitable method known to those skilled in the art, including but not limited to the use of electrically conductive adhesives (ECAs) and/or the use of solders.

As further depicted in FIG. 1A, the electrically conductive tab ribbons 14 are positioned across a central area of the solar cells 12 thereby being fully visible from a top surface of the solar cell and blocking some sunlight or shading some portion of the solar cells 12.

In FIG. 1B, a top view of a second type of solar module 19 formed from an array of shingled strips of solar cells 18 combined to form a string 16, wherein the strings 16 are interconnected electrically via conductive bus ribbons 17a-d. In addition, the solar cells may be interconnected electrically via conductive tab ribbons (not shown) positioned on a bottom side of solar module 19 opposite the top side depicted in FIG. 1B. The electrically conductive ribbons, such as bus ribbons 17a-d and tab ribbons, are designed to carry the electric output produced by the solar cells from one solar cell to another neighboring solar cell and/or from one strip to another neighboring strip and/or from one string to another string. The electrically conductive ribbons, such as bus ribbons 17a-d and the tab ribbons, can be fixed to the solar cells or solar module by any suitable method known to those skilled in the art, including but not limited to the use of electrically conductive adhesives (ECAs) and/or the use of solders.

Electrically conductive ribbons for solar cells or modules are commonly made from metallic materials. Some examples of suitable metallic materials which efficiently conduct electricity include copper, gold, silver, tin, iron, nickel, lead, and the like. In addition, the conductive ribbons may be coated with metal alloys which will not only protect the copper but also provide better bonding to the solar cells. The metal alloys include, but are not limited to, Pb/Sn, Pb/Sn/Ag, Sn/Ag, Bi/Sn/Ag, etc.

In any case, the ribbons are great for conducting electricity but are solid pieces of metal which can shade at least a portion of the solar cell or module and further can be easily soiled with contaminants during processing. Contaminants on the bottom side or inwardly facing side of the ribbon can decrease the surface area of the electrical contact points between the ribbon and the solar cell, the solar module, and/or other ribbons, thereby decreasing the efficiency of the ribbon to conduct electricity.

In addition, the ribbons are not aesthetically pleasing because the uncoated ribbons may stand out against and/or may be in stark contrast to, the black or blue background of the average solar cell or module. Thus, it would be beneficial aesthetically to be able to add a color to the ribbons on the top side or outwardly facing side of the ribbon while improving efficiency of the ribbon by optimizing a contaminant free bottom side or inwardly facing side as a result of the coating process, as described herein.

Figure 2:
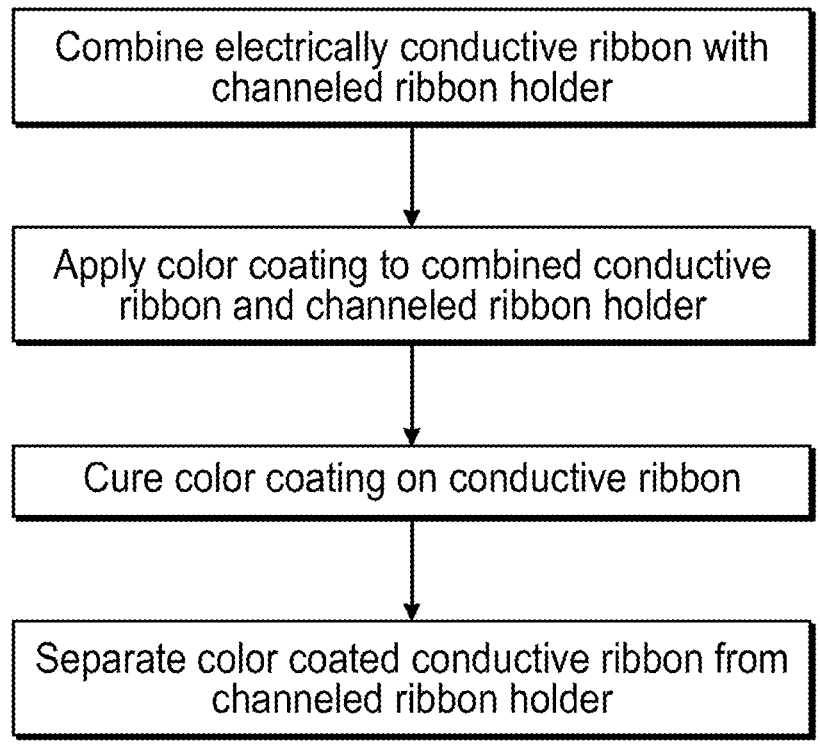
FIG. 2 depicts a flow diagram of a method of forming colored conductive ribbons as described in at least one embodiment herein.

As shown in FIG. 2, a colored conductive ribbon(s) can be manufactured from at least the steps provided. Generally, at least one conductive ribbon is combined with a channeled ribbon holder and a color coating is applied to at least one side of the conductive ribbon. In embodiments, the color coating is also applied to at least some portion of the channeled ribbon holder. In embodiments, the coating is applied only to the top side of the ribbon.

In embodiments, the color coating is applied by placing the combined conductive ribbon and ribbon holder into a coating device, i.e., a screen-coater, roll-coater, or spray-coater, and the color coating is screened, sprayed, and/or rolled onto at least the top surface of the conductive ribbon. The color coating on the conductive ribbon is then cured to form a colored conductive ribbon on at least one side, i.e., the top side facing outward from the channel, and the conductive ribbon is separated from the channeled ribbon holder. The present process is intended to leave a bottom side, i.e., the side opposite the top side, of the conductive ribbon uncoated. It is envisioned that the uncoated bottom surface will be the surface on which the conductive ribbons described herein will be attached to the solar cells, solar modules, and/or other ribbons. In some embodiments, the color coating is cured using a heating process. In some embodiments, the color coating is cured using a UV process.

In some embodiments, the coating is cured and then separated from the ribbon holder. For example, this may be in a reel to reel processing scenario where the ribbon is constantly fed through the ribbon holder as it is unwound from a reel of ribbon material and wound onto a new reel of coated ribbon material. In other embodiments, the ribbon may be separated from the ribbon holder before and/or during the curing process.

As provided herein, a color-coating is intended to encompass a composition including at least one color, pigment, and/or dye. It is envisioned that any color may be used. However, some particularly embodiments, the color-coating may be a composition which renders the conductive ribbons black, such as black paint or ink. In some other particular embodiments, the color-coating may be a composition which renders the conductive ribbons white, such as white paint or ink. In some embodiments, the paint may be an electrically conductive paint, i.e., BARE® conductive electric paint. In embodiments, the paint may be a thermally insulative paint. In embodiments, the color coating may form a textured coating suitable for improving the amount of light reflected from the ribbons back to the solar cells.

In addition to the color, pigment, and/or dye, the color coatings described herein may include various other ingredients commonly associated with color coatings, such as binders, extenders, solvents, volatile organic compounds, dispersants, thixotropic agents, driers, bactericides, fungicides, algaecides, fragrances, and combinations thereof. In embodiments, the color coating is a liquid. In embodiments, the color coating is a powder.

Figure 3A:
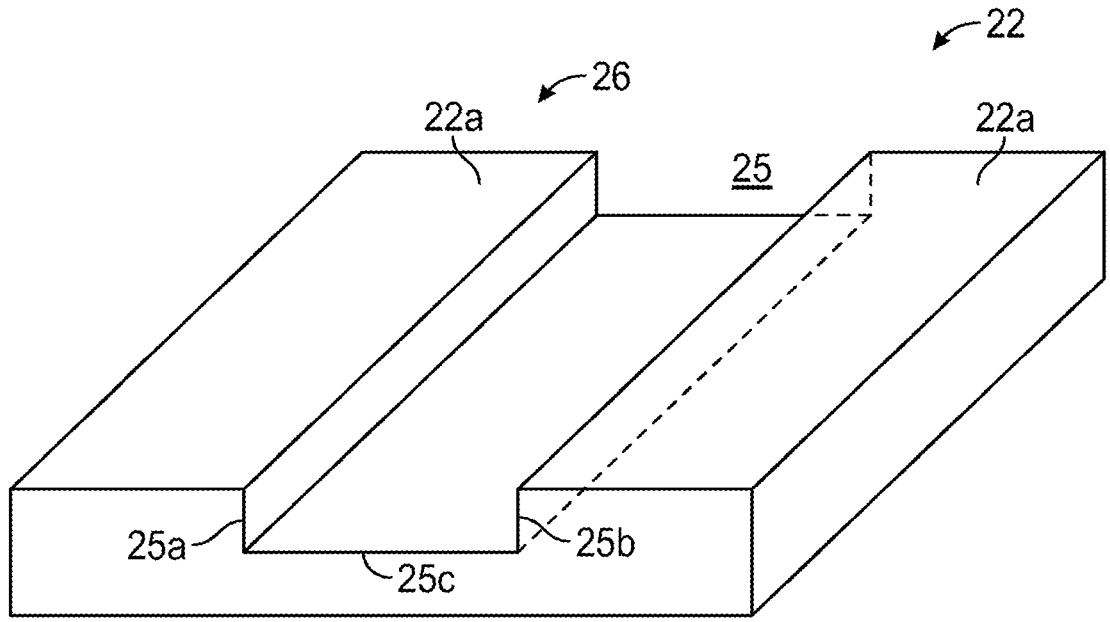
FIG. 3A is a perspective view of a ribbon holder including at least one channel as described in at least one embodiment herein.
Figure 3B:
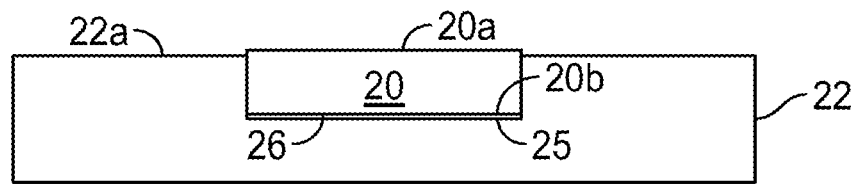
FIGS. 3B and 3C are cross-sectional views of ribbon holders including a conductive ribbon secured in a channel as described in at least one embodiment herein.

Turning now to FIGS. 3A and 3B, the ribbon holder 22 includes at least one channel 25 dimensioned and configured to receive the at least one conductive ribbon 20. For example, the channel includes a channel length, channel width, and/or channel depth generally equal to the ribbon length, ribbon width, and/or ribbon height of the conductive ribbon 20 thereby ensuring a suitably snug yet removable fit of the ribbon 20 within the channel 25. The ribbon holder 22 includes a holder length, holder width, and holder height, wherein at least the holder width and holder height of the holder 22 is greater than the ribbon width and ribbon height of ribbon 20.

Figure 3C:
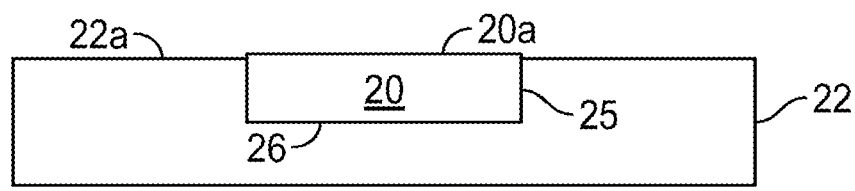

In some embodiments, as shown in FIG. 3C, the channel depth of channel 25 may be less than the ribbon height of the conductive ribbon 20, which may assist in limiting the application of the color coating to only the conductive ribbon 20 (and not the ribbon holder 22) because the top surface 20a of the conductive ribbon 20 will extend beyond the top surface 22a of the holder 22.

The channel 25 may include a pair of sidewalls 25a, 25b which define the channel depth by extending from the top surface 22a of the ribbon holder 22 to the bottom surface 25c of the channel 25. As shown, the sidewalls 25a, 25b may be generally parallel to each other and connected to each other via the base surface 25c of the channel 25 which may be generally perpendicular to the sidewalls 25a, 25b. It is envisioned however, that in some other embodiments, the sidewalls may not be generally parallel to each other and/or the base surface may not be generally perpendicular thereto. Also, although depicted as generally rectangular shapes, the ribbon holders, channels, and/or conductive ribbon may of any shape suitable for performing the methods described herein.

As further illustrated in FIGS. 3A-3C, the base surface 25c may includes an adhesive 26 for removably or temporarily securing the conductive ribbon 20, particularly the bottom surface 20b of the conductive ribbon 20, within the channel 25 during the coating processes described herein. The coating can also operate as an overspray barrier preventing adhesion of any of the coating on the uncoated surface of the ribbon. As the adhesion bond between the base surface 25c of the channel 25 and the bottom surface 20b of the conductive ribbon 20 is only intended to be temporary, the bond strength is configured to be sufficient to withstand the forces applied thereto during any coating and/or curing processes, while remaining configured to be broken by forces slightly higher than those applied during the coating and/or curing processes, so the ribbon can eventually be removed from the channel fairly easily. The adhesive layer may be readily removed from the underside of the ribbon using one or more solvents, even water, to ensure a clean surface for eventual bonding with the strings 11 and electrical conduction therethrough. Alternatively, the adhesive may be selected to have a greater adhesion to the holder than the ribbon and thus remain in place when the ribbon is removed from the holder, and the solvents may be applied to the holder to remove the adhesive. Some non-limiting examples of suitable adhesives include pressure sensitive adhesives, hot-melt adhesives, dissolvable adhesives, reactive adhesives, two-part adhesives, synthetic adhesives, bio-adhesives, and combinations thereof.

In some embodiments, the adhesive is a pressure sensitive adhesive. Some pressure sensitive adhesives may include of an elastomer, such as natural rubber, vinyl ethers, acrylics, butyl rubber, styrene block copolymers, silicones and nitriles. In some embodiments, the pressure sensitive adhesive may be selected based on the adhesive's adhesion strength over a certain period of time. For example, the pressure sensitive adhesive may be a peelable PSA wherein the adhesive is intended to be removed at some point of time without damaging the ribbon and/or the ribbon holder. Other non-limiting examples include high-tack PSAs, permanent PSAs, and/or freezer PSAs.

In addition, the adhesive 26 may prevent and/or remove possible contaminants from the bottom surface 20b of the conductive ribbon 20 when the ribbon is removed from the channel. For example, any contaminants on the bottom surface of the ribbon may become secured to the adhesive during the coating and/or curing processes described herein and remain adhered to the adhesive when the ribbon is separated from the channel thereby providing a top side of the ribbon which is color coated and bottom side of the ribbon including a reduced amount of contaminants and/or free of any contaminants.

Figure 4:
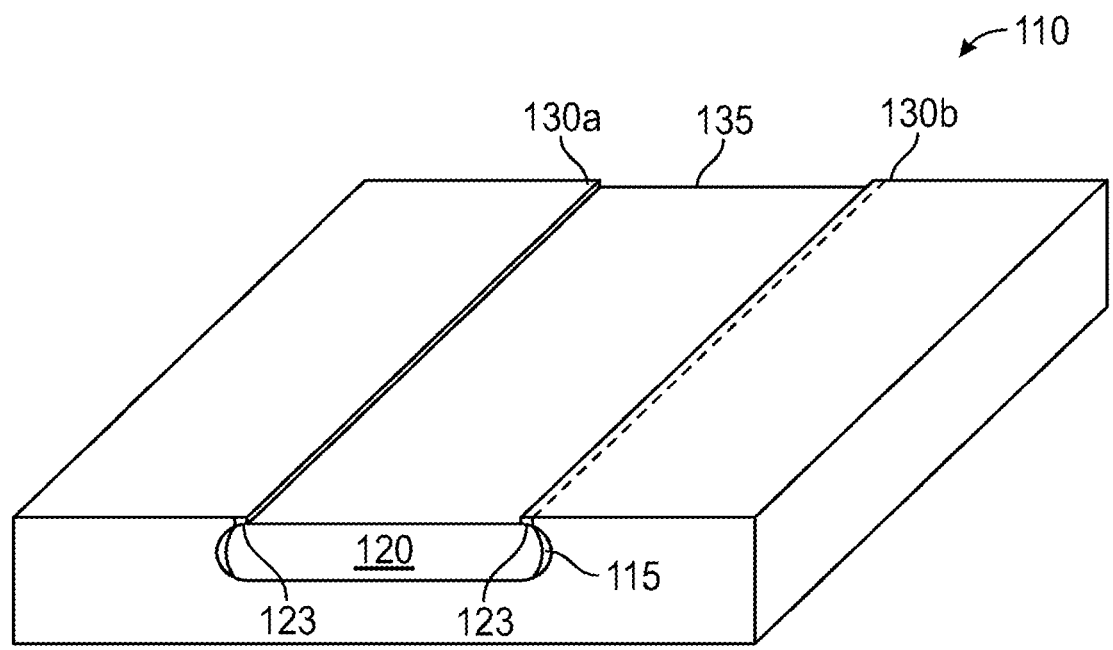
FIG. 4 is a perspective view of a ribbon holder including a conductive ribbon as described in at least one embodiment herein.

In FIG. 4, a ribbon holder 110 is depicted including a channel 115 in receipt of a conductive ribbon 120 and a pair of masking tabs 130a, 130b. Masking tabs 130a, 130b define an opening 135 having an opening width less than the channel width. Such a configuration allows the masking tabs 130a, 130b to prevent some portions, in this instance the outer edges 123 of the top surface 122 of the conductive ribbon 120 from receiving any color coating during the application process. Although depicted as having a generally straight edge, it is envisioned that the edges of the masking tabs 130a, 130b may be the same or different and may be of any shape or configuration, i.e., rounded, sinusoidal, jagged, etc.

In some embodiments, the masking tabs may be made from the same material used to form the ribbon holder. In some embodiments the masking tabs may be added to the ribbon holder separately. In some embodiments, the masking tabs may be removable and/or replaceable from the ribbon holder. In some embodiments, the masking tabs may be made from a paper, rubber, silicone, or plastic material suitable for preventing the color coating material from being applied to at least a portion of the conductive ribbon.

As shown in FIGS. 3 and 4, in some embodiments, the ribbon holder can be a single layer of sheet material, i.e., a single sheet. In other embodiments, as depicted in FIGS. 5 and 6 and described in more detail below, the ribbon holder can be formed of multiple layers of sheet material, i.e., multiple sheets.

The ribbon holders described regardless of layers may be made from any material suitable for securing the ribbon during the coating and/or curing processes described herein. For example, in some embodiments, the ribbon holder may be made from plastic or polymeric materials which can be molded, pressed, extruded, and the like to form the overall shape of the holder. In some embodiments, the ribbon holder maybe made from paper and/or paper-like products such as cardboard.

In some embodiments, the channeled ribbon holder may be formed from any suitable molding, extruding, and/or pressing process. In some embodiments, the channel of the ribbon holder of a single sheet may be formed after formation of the ribbon holder, i.e., by cutting out material from the ribbon holder to form the channel.

Figure 5:
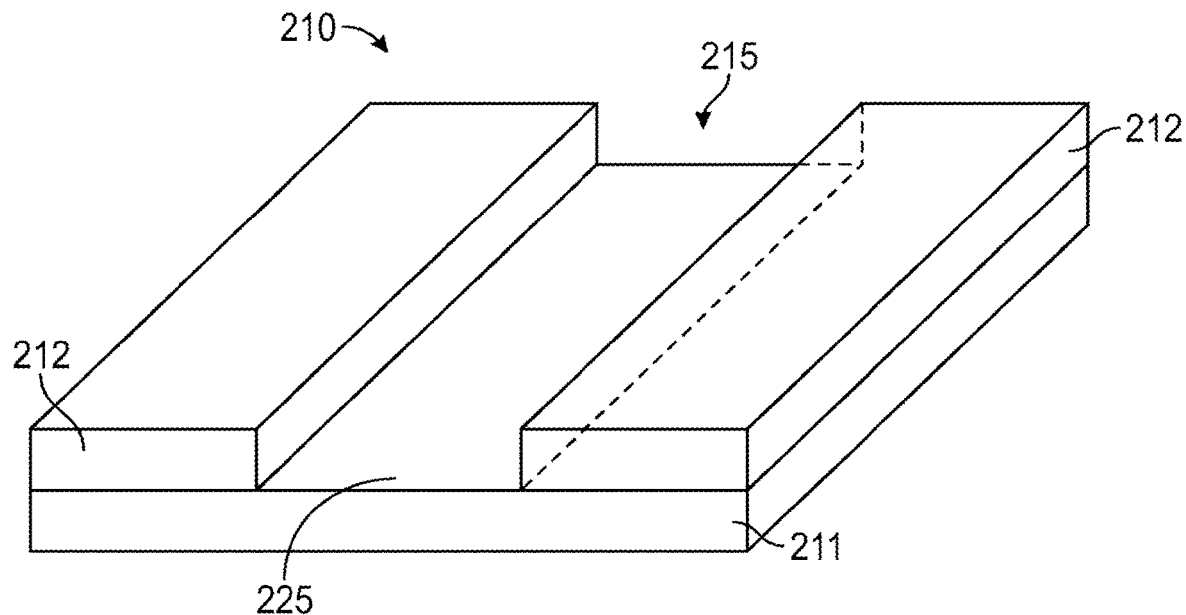
FIG. 5 is a perspective view of a ribbon holder including at least one channel as described in at least one embodiment herein.
Figure 6:
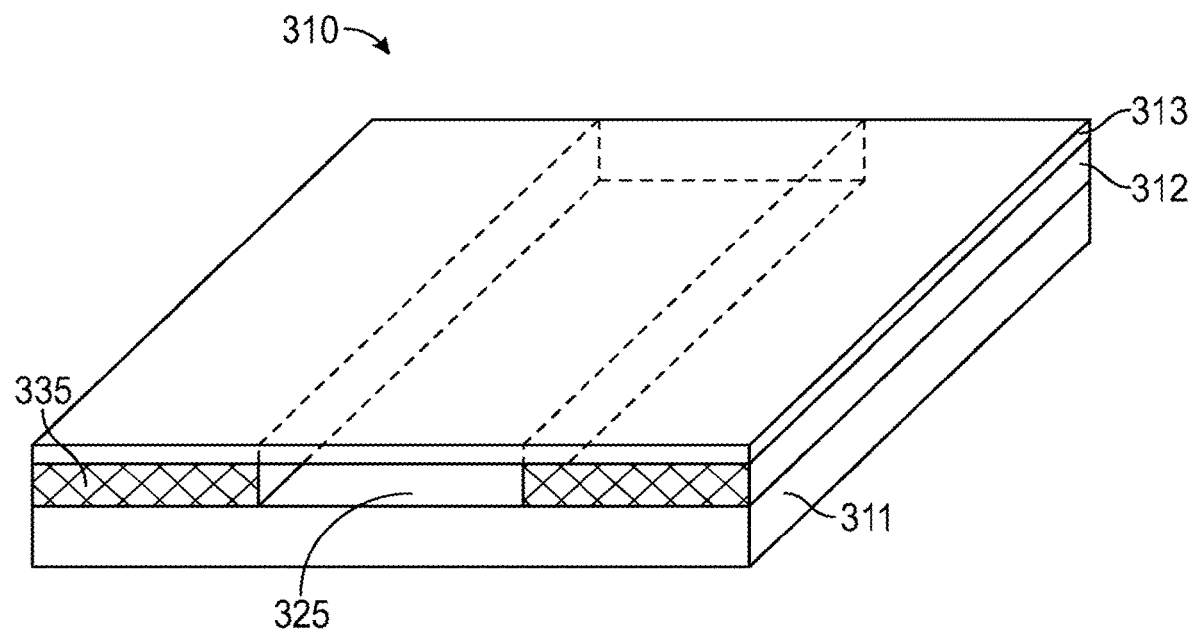
FIG. 6 is a perspective view of a ribbon holder including at least one channel as described in at least one embodiment herein.

Turning to FIG. 5, the ribbon holder 210 include at least one masking sheet 212 positioned directly on top a base sheet 211 including and/or coated with an adhesive 225. Ribbon holder 210 includes channel 215 formed in or by the at least one masking sheet 212. For example, in some embodiments, a plurality of masking sheets may be positioned directly upon base sheet 211 in a spaced apart configuration creating gaps or channels between each of the masking sheets and leaving a portion of the base sheet exposed or uncovered creating the channel therebetween. In some other embodiments, a single masking sheet 212 may be positioned directly upon base sheet 211 and then the masking sheet may be cut to remove a portion of the masking sheet from the base sheet 211 thereby creating the channel 215.

In some embodiments, the ribbon holder includes one channel or at least one channel. In other embodiments, the ribbon holder includes multiple channels, which in turn may receive multiple conductive ribbons. In embodiments, one channel receives one ribbon.

Figure 7:
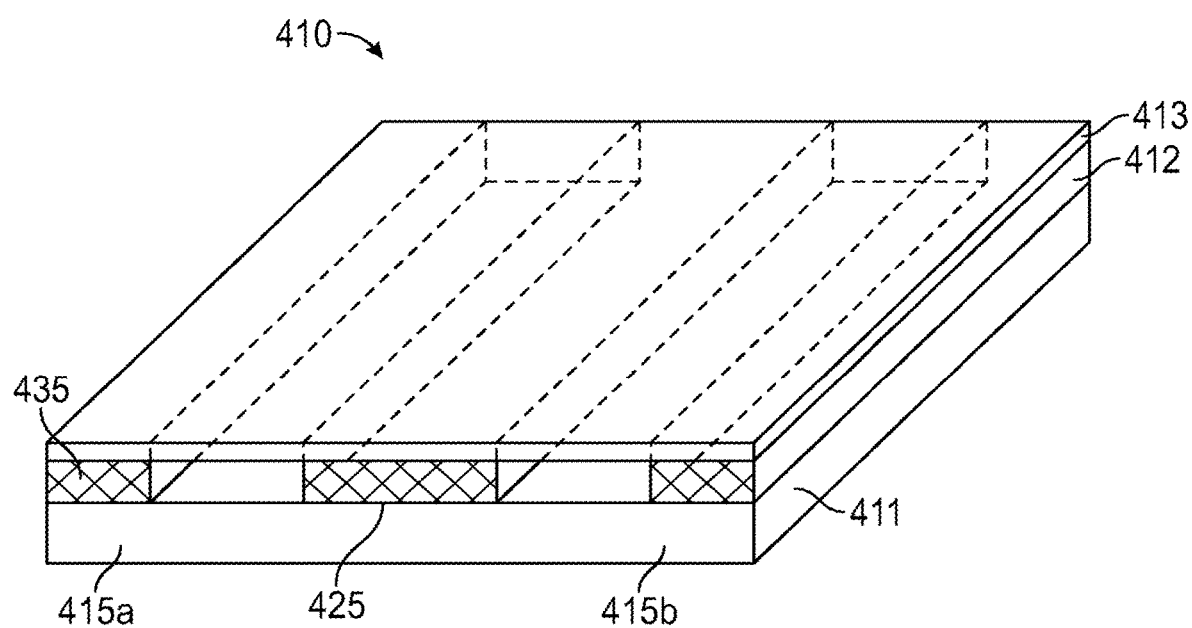
FIG. 7 is a perspective view of a ribbon holder including at least one channel as described in at least one embodiment herein.

As shown in FIGS. 6 and 7, the ribbon holders 310, 410 may be formed from two or more sheets, and particularly, three sheets, i.e., base sheet 311, 411, masking sheet 312, 412, and protective sheet 313, 413. The masking sheets 312, 412 are positioned directly on top a base sheet 311, 411 via an adhesive 325, 425 and form channels 315, 415a, 415b. The protective sheets 313, 413 are positioned directly on a top of masking sheets 312, 412 via adhesive 335, 435 and the protective sheets 313, 413 are intended to at least prevent premature access to the channels 315, 415a, 415b to the ribbons and/or contaminants.

In some embodiments, the protective sheet 313, 413 may be combined with the masking sheet 312, 412 to predetermine the width of the channels 315, 415a, 415b prior to be adding to the base sheet 310, 410. The protective sheet is typically removed from the masking sheet after formation of the channel and prior to receipt of the conductive ribbon within the channel.

Turning to FIG. 8, a process is illustrated for forming a colored conductive ribbon as described herein. Initially, a base sheet 511 including a top surface coated with an adhesive is combined with a masking sheet 512, and particularly, the masking sheet 512 covers a majority, if not the entire, base sheet 511. Once combined, the masking sheet 512 is cut to remove a portion of the masking sheet 512 thereby creating a channel 515. The masking sheet may be cut using any suitable method. Some non-limiting examples include cutting with a laser, a knife, a blade, ultrasonics, a press, scissors, and the like. Upon removal of the cut piece of masking sheet 512 and the formation of channel 515, a conductive ribbon 520 is positioned and/or secured within the channel 515 and the sidewalls are formed from the remaining portions of the masking sheet 512. In embodiments, the conductive ribbon 520 is secured in the channel 515 via the adhesive positioned on the top surface of the base sheet 511. It is envisioned that in some instances, the adhesive may be reapplied to the base surface of the channel upon removal of the cut piece of the masking sheet and prior to receipt of the ribbon, as removal of the cut piece may also remove some of the adhesive originally positioned on the base sheet.

As further shown in FIG. 8, the top surface of the conductive ribbon 520 is uncolored and/or displays a metallic finish prior to coating. Next, a color coating is applied to the conductive ribbon 520 secured in the channel 515 of the ribbon holder 513, the color coating on the conductive ribbon 520 is cured, and the color coated conductive ribbon is separated from the channel of the ribbon holder.

In some embodiments, the color coated conductive ribbon 520 is physically separated from the channel 515 of the ribbon holder 513 after curing. For example, in some instances, the cured color coated conductive ribbon 520 can be peeled away from the channel 515, and more particularly peeled away from the adhesive on the top surface of the base sheet 511. In such instances, once the ribbon is peeled away from the ribbon holder, no portion of the ribbon holder remains in contact with the ribbon.

In some embodiments, the color coated conductive ribbon 520 is physically separated from the ribbon holder 513 by cutting or punching the ribbon 520 free of the ribbon holder 513. When cut or punched free from the ribbon holder 513, at least some portion of the base sheet 511 may also be cut or punched free of the ribbon holder 513 and remain adhered to ribbon 520 thereby leaving the ribbon 520 adhered to at least a portion, if not all, of the base sheet 511.

As further depicted in FIG. 8, the colored conductive ribbon may be a solid ribbon 520a or a ribbon including pores 520b. It is envisioned that the pores may be added at any time during the processes described herein. For example, in some embodiments, the pores may be added to the conductive ribbons prior to entering the channel. In such embodiments, the color coating, when applied, may not only cover the top surface of the ribbon but also some portion, if not all, of the inner wall of the pore defined in the thickness of the ribbon.

In some other embodiments, the pores may be added to the conductive ribbon after the coating is applied. In still other embodiments, the pores may be added to the conductive ribbon after the curing of the coating and/or upon separation of the ribbon from the channel. In such embodiments, the inner walls of the pores may not include the color coating.

In some embodiments, the pores may be symmetrically distributed across the ribbon.

In some embodiments, the pores may be non-symmetrically distributed across the ribbon. For example, the pores may be closer to one edge of the ribbon than another edge of the ribbon. Due to the non-symmetrical distribution of the pores, the surface area of the ribbon which is adhered to the base sheet 511 may not be evenly distributed. Removal of the adhered base sheet 511 will cause the ribbon to produce a curved surface because the peeling force of the base sheet 511 cannot be evenly distributed across the ribbon due to the asymmetrical pores. Therefore, in such embodiments, it may be beneficial to remove the color coated ribbon completely from the base sheet 511 (as well as the channel or ribbon holder) prior to the formation of the asymmetrical pores to prevent curving or bowing of the non-symmetrical pored ribbon.

Figure 8A:
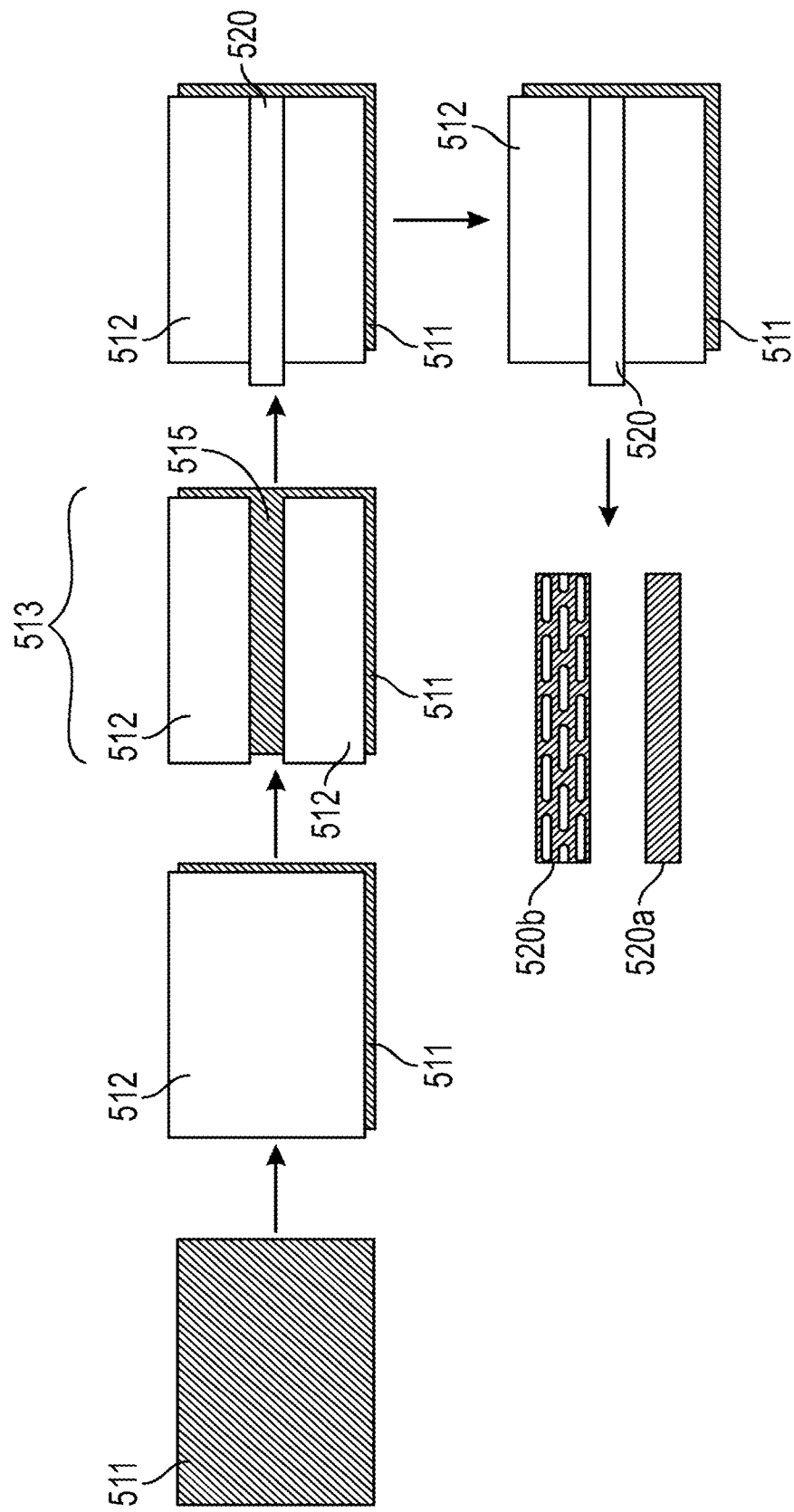
FIGS. 8A and 8B are schematic views of methods of forming colored conductive ribbons as described in at least one embodiment herein.
Figure 8B:
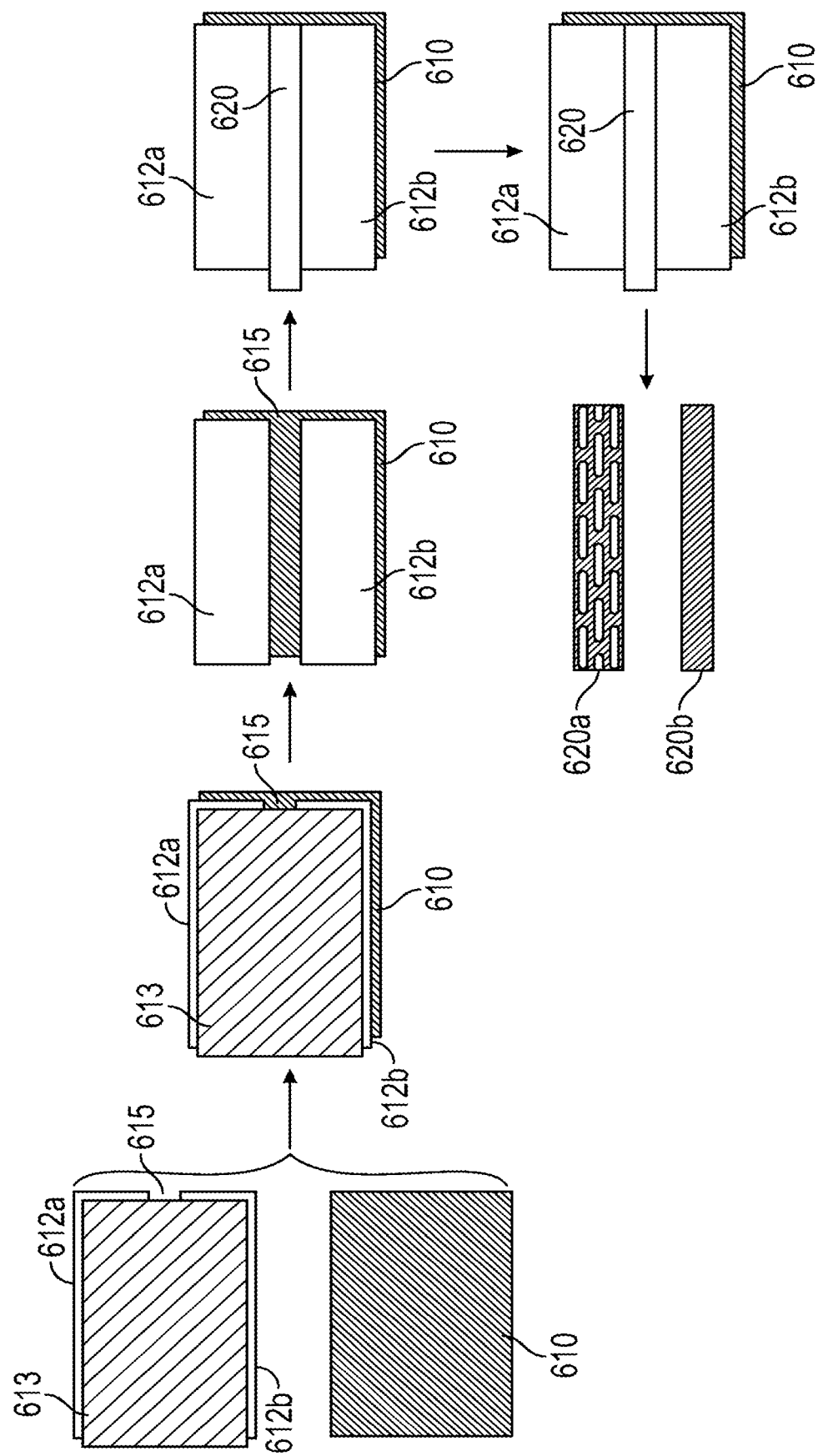

In FIG. 8B, another process is illustrated for forming a colored conductive ribbon as described herein. Initially, a plurality of masking sheets 612a, 612b spaced apart from each other and secured to an outer protective sheet 613 via an adhesive are combined with a base sheet 610, the masking sheets 612a, 612b positioned between the protective sheet 613 and the base sheet 610. The protective sheet 613 temporarily covers the masking sheets 612a, 612b, the base sheet 610, and the channel 615. Once combined, the protective sheet 613 is removed from the masking sheets 612a, 612b to provide access to the channel 615. Upon removal of the protective sheet 613, a conductive ribbon 620 is positioned and/or secured within the channel 615 via an adhesive and the sidewalls formed from the remaining portions of the masking sheets 612a, 612b. Next, a color coating is applied to the conductive ribbon 620 secured in the channel 615 of the ribbon holder 614, the color coating on the conductive ribbon 620 is cured, and the color coated conductive ribbon is separated from the channel of the ribbon holder 614.

Although FIGS. 8A and 8B depict processes utilizing a multilayer ribbon holder similar to those shown in FIGS. 5 and 6, it is envisioned that the processes of coating a conductive ribbon described in FIGS. 8A and 8B may alternatively utilize a single layer ribbon holder, such as any of the ribbon holders shown in FIGS. 3A, 3B, 3C, 4 and/or 7.

In some embodiments, the conductive ribbons may be coated in a manner generally as shown in FIG. 8A or 8B wherein the ribbon holder of FIG. 4 is utilized, as either a single or multilayer ribbon holder. As shown in FIGS. 9A and 9B, the conductive ribbon 650, 660 is coated utilizing the ribbon holder of FIG. 4 to form a coated conductive ribbon 650a, 660a having first and second uncoated outer edge portions 653a, 653b, 663a, 663b which extend longitudinally along the length of the coated ribbon 650a, 660a. Uncoated outer edge portions 653a, 653b, 663a, 663b are positioned on either side of a coated central portion 655, 665.

Uncoated outer edge portions 653a, 653b, 663a, 663b can be removed or separated from the coated central portion 655, 665 to form a coated conductive ribbon 650b, 670a, 670b, 670c including only coated central portion 655, 665. The uncoated outer edges 653a, 653b, 663a, 663b can be mechanically cut or separated from coated central portion 655, 665 using any suitable method, including but not limited to cutting with a blade, press, punch or laser.

By utilizing ribbon holders similar to FIG. 4, the outer edges of the conductive ribbon remain uncoated and prevent the coating from reaching the rear side of conductive ribbon during the coating and/or curing processes. As a result, in some embodiments, the channel of the conductive ribbon of FIG. 4 may not include an adhesive and/or the rear side of the conductive ribbon of FIGS. 9A and 9B may not be attached to an adhesive or tape during the coating process.

Figure 10A:
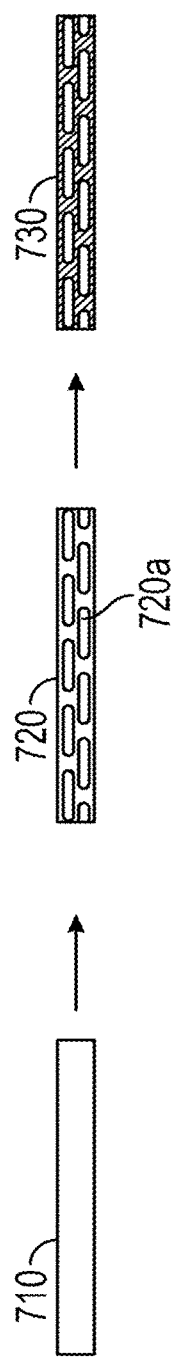
FIGS. 10A and 10B are schematic views of methods of forming colored conductive ribbons as described in at least one embodiment herein.
Figure 10B:
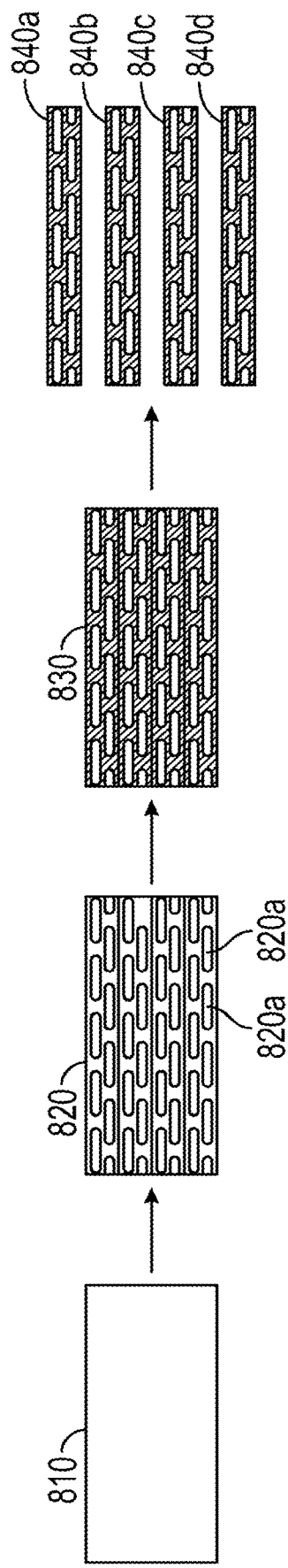

As further depicted in FIGS. 8A, 8B, 9A, and 9B, the colored conductive ribbons may be a solid (free of pores) ribbon 520a, 620a, 670a, 670b, 670c, 655 or a ribbon including pores 520b, 620b, 650b, 675a, 675b, 675c. It is envisioned that the pores may be added to the ribbon at any time during the processes described herein. For example, in some embodiments as shown in FIGS. 10A and 10B, the pores may be added to the conductive ribbons prior to entering the channel and/or prior to the application of the color coating. In such embodiments, the coating composition when applied may not only cover the top surface of the ribbon but also some portion, if not all, of the inner wall of the pore defined in the thickness of the ribbon.

In some other embodiments, as shown in FIGS. 9A, 9B, 11A and 11B, the pores may be added to the conductive ribbon after the color coating is applied and/or cured. In still other embodiments, the pores may be added to the conductive ribbon after the curing of the coating and/or upon separation of the ribbon from the channel. In such embodiments, the inner walls of the pores may not include the color coating.

As shown in FIGS. 9A, 9B, and 10A, in some embodiments, an electrically conductive ribbon 655, 665, 710 free of pores (solid) may be processed in some manner to include pores. In embodiments, the pores are formed via a punching process. The process of punching or removal of some portion of the conductive ribbon to form the pores can be performed in several ways, such as a mechanical punching processes or laser ablation/cutting processes. In particular embodiments, the pores may be created with a punch. Once punched (pores formed), the punched conductive ribbon may be coated via one of the processes described herein. As specifically shown in FIGS. 9A, 9B, and 10A, the punched conductive ribbons may be coated with a color coating, i.e., a black paint or composition, and cured to produce a colored and/or black conductive ribbon.

In some embodiments, as shown in FIGS. 9B and 10B, the conductive ribbon that is processed may have a sufficient width that following the coating processes described herein, the colored conductive ribbon can be then sliced into a plurality of thinner strips having a smaller width suitable as either a tabbing ribbon or bus ribbon.

As further depicted in FIG. 10B, an extra wide electrically conductive ribbon 810 free of pores (solid) may be processed in some manner to include pores. In embodiments, the pores are formed via a punching process. The process of punching or removal of the some portion of the conductive ribbon to form the pores can be performed in several ways, such as a mechanical punching processes or a laser ablation processes. In particular embodiments, the pores may be created with a punch. Once punched (pores formed), the punched conductive ribbon 820 may be coated via one of the processes described herein with a color coating. As specifically shown in FIG. 10B, the punched conductive ribbon 820 may be coated with a color coating, i.e., a black paint or composition, and cured to produce a colored and/or black conductive ribbon 830. The colored and/or black conductive ribbon may then be sliced into a plurality of thinner strips having a smaller width 840a-d. The step of slicing may be performed using a plurality of lasers, knives, blades, ultrasonics, presses, scissors, and combinations thereof.

As shown in FIG. 11A, in some embodiments, an electrically conductive ribbon 910 free of pores (solid) may be coated via one of the processes described herein with a color coating. Once coated and/or cured, the color coated conductive ribbon may be processed in some manner to include pores. In embodiments, the pores are formed via a punching process. The process of punching or removal of the some portion of the coated conductive ribbon to form the pores can be performed in several ways, such as a mechanical punching processes or a laser ablation processes. In particular embodiments, the pores may be created with a punch.

As specifically shown in FIG. 11A, the conductive ribbon 910 may be coated with a color coating, i.e., a black paint or composition, and cured to produce a colored and/or black conductive ribbon 920, which can subsequently be punched to form pores within the coated conductive ribbon forming a color coated porous conductive ribbon and/or a black coated porous conductive ribbon 930.

In some embodiments, as shown in FIG. 11B, the conductive ribbon 950 that is processed may have a sufficient width that following the coating processes described herein, the colored conductive ribbon 950 can be then sliced into a plurality of thinner strips having a smaller width suitable as either a tabbing ribbon or bus ribbon.

As further depicted in FIG. 11B, an extra wide electrically conductive ribbon 950 free of pores (solid) may be coated with a color coating, i.e., a black paint or composition, and cured to produce a colored and/or black conductive ribbon 960. In some embodiments, the colored and/or black conductive ribbon 960 may be processed in some manner to include pores. In embodiments, the pores are formed via a punching process. The process of punching or removal of the some portion of the conductive ribbon to form the pores can be performed in several ways, such as a mechanical punching processes or a laser ablation processes. In particular embodiments, the pores may be created with a punch. Once punched (pores formed), the punched colored conductive ribbon 970 may be sliced into a plurality of thinner strips having a smaller width 980a-d. The step of slicing may be performed using a plurality of lasers, knives, blades, ultrasonics, presses, scissors, and combinations thereof coated via one of the processes described herein with a color coating.

In alternative embodiments, the colored and/or black conductive ribbon 960 may be sliced into a plurality of thinner strips having a smaller width 975a-d prior to being made to include pores, i.e., punched. Once sliced into thinner strips, the plurality of strips may be collectively or individually processed to include pores, i.e., punched, to form punched strips of colored conductive ribbons 980e-h.

In still other embodiments, as depicted in FIGS. 12A-16, the conductive ribbons described herein may be roughened, at anytime during the manufacturing process, to add a textured surface to at least a portion of the ribbon surface. By adding a textured surface to the ribbon, the bond strength or peeling strength of the ribbon is greatly improved when adhered or bonded to a solar cell (including solar strips or solar modules) along the textured portion of the ribbon.

In some embodiments, the ribbons may be roughened to include a textured surface prior to coating. In some embodiments, the ribbons may be roughened to include a textured surface after coating.

The textured surface may be continuous or discontinuous along any outer surface of the ribbon. In some embodiments, the textured surface is only on portions of the outer surface of the ribbon which are not coated. In some embodiments, the textured surface is only on coated portions of the outer surface of the ribbon. In some embodiments, the textured surface is on coated portions and non-coated portions of the outer surface of the ribbon.

Figure 12A:
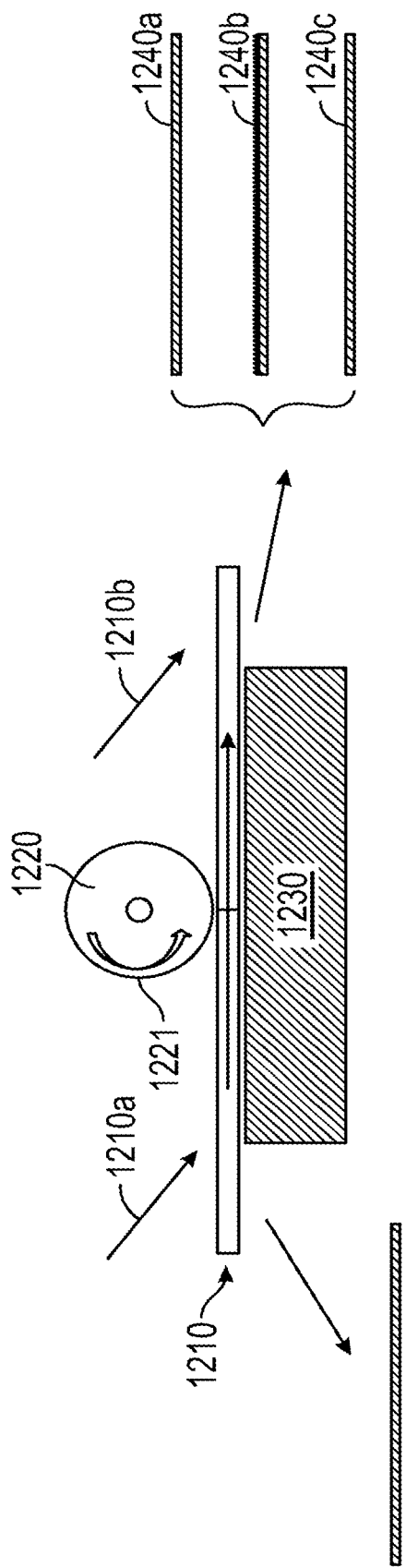
FIGS. 12A and 12B are schematic cross-sectional side views of methods of roughening conductive ribbons as described in at least one embodiment herein.

As depicted in FIG. 12A, in some embodiments, the conductive ribbon 1210 can be passed between at least one roughening element 1220 and a generally flat hard surface 1230 to produce a textured surface 1240a-c on at least one surface of the conductive ribbon 1210. As further depicted in FIG. 12A, the roughening element 1220 is a roller which rotates as indicated by the arrow forcing outer surface 1221 of the roller 1220 against a first surface 1210b of ribbon 1210 to roughen the surface creating a texture. Specifically, the conductive ribbon 1210, either coated or uncoated, may initially have a smooth non-textured surface 1210a prior to passing by the roughening element 1220. The roughening element 1220 having an outer surface 1221 configured to roughen smooth surface 1220a against hard surface 1230 to produce a textured surface 1240a-c on at least a first side 1210b of ribbon 1210. The texture of the textured surface may be random (surface 1240a) or patterned (surface 1240b, 1240c) of various depths. The roughening element 1220 may include an outer surface 1221 including a patterned coarseness which when applied to the ribbon 1210, under the correct conditions, i.e., pressure, temperature, length of time, etc., transfers the mirror image of the patterned coarseness to at least a first side 1210b of ribbon 1210. Although illustrated as a process performed in a single pass and in a single direction, it is envisioned that any of the roughening processes described herein may include multiple passes of the ribbon over the roughening element and/or in any number of directions.

Figure 12B:
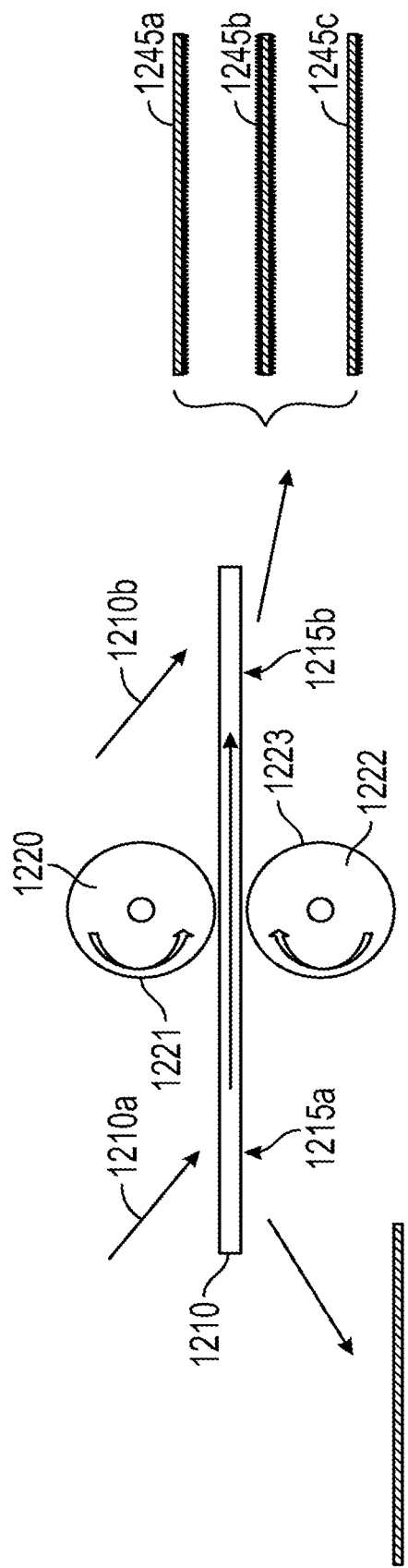

As depicted in FIG. 12B, in some embodiments, the conductive ribbon 1210 can be passed between a plurality of roughening elements 1220, 1222 to produce a textured surface 1245a-c on at least two surfaces of the conductive ribbon 1210. The two surfaces being opposite each other, such as a top and bottom surface. Roughening elements 1220, 1222 are depicted as rollers which rotate as indicated by the respective arrows forcing outer surfaces 1221, 1223 of the rollers 1220, 1222 against a first smooth surface 1210*b* and a second smooth surface 1215*b* of ribbon 1210 to roughen the ribbon on multiple surfaces creating a texture thereon. Specifically, the conductive ribbon 1210, either coated or uncoated, may initially have a generally smooth non-textured surface 1210*a*, 1215*a* prior to passing by the roughening element 1220, 1222 to produce a dual-sided textured ribbon including first textured surface 1210*b* and second textured surface 1215*b*.

Figure 13:
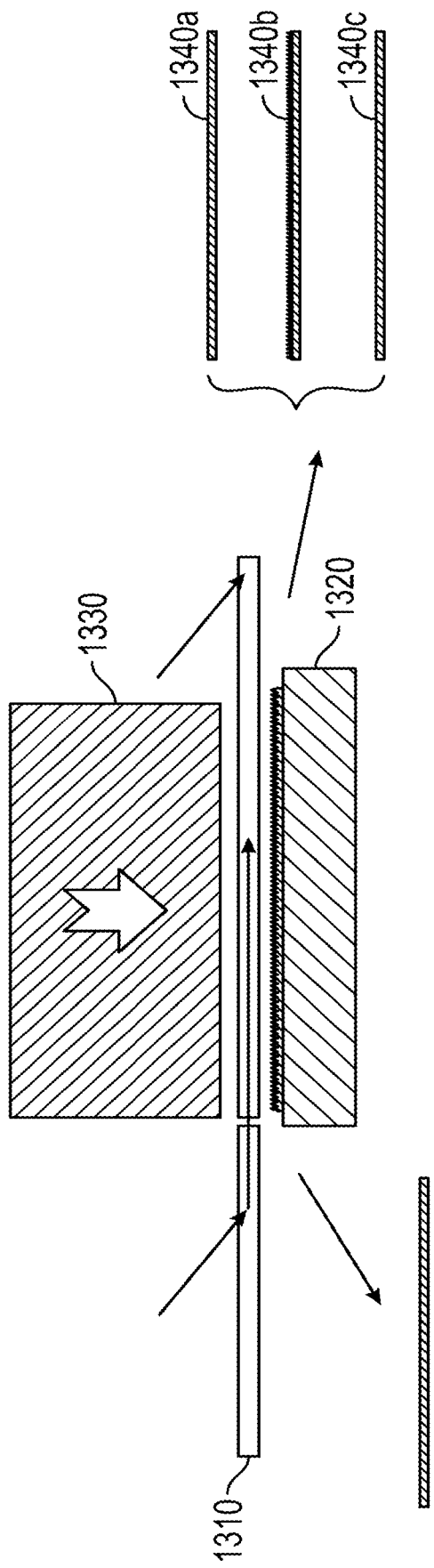

As depicted in FIG. 13, in some embodiments, the conductive ribbon 1310 can be passed between a press 1330 and at least one roughening element 1320, such as a textured linear surface, to produce a textured surface 1340*a-c* on at least one surface of the conductive ribbon 1310. In such embodiments, the textured linear surface of roughening element 1320 may be stationary while the press 1330 is configured to move or slide (as indicated by the arrow) towards the roughening element 1320 while the ribbon 1310 is positioned therebetween. It is envisioned that in some embodiments, the press may also a textured surface configured to roughen a second surface opposite the first surface. In addition, in some embodiments, both the press and the roughening element are configured to move or slide towards each other with the ribbon positioned therebetween.

Figure 14:
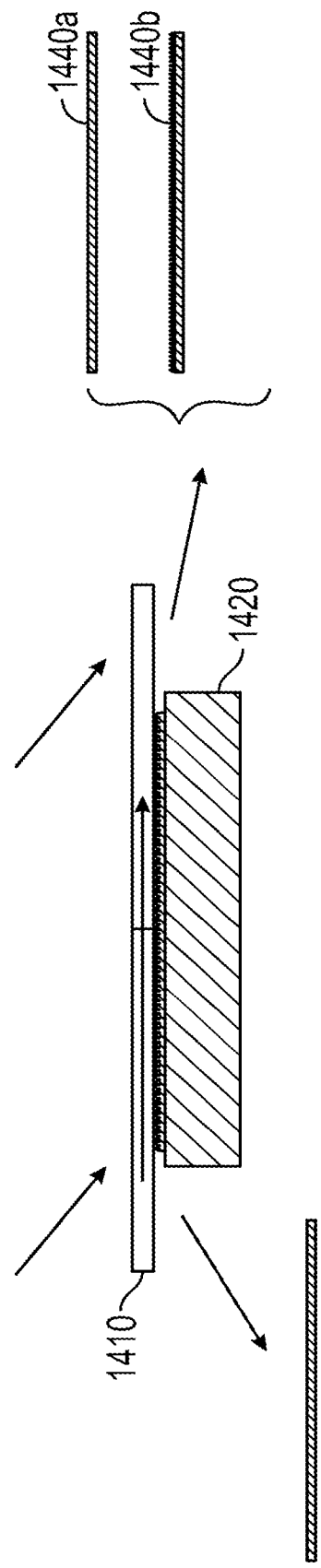

As depicted in FIG. 14, in some embodiments, the conductive ribbon 1410 can be ground over a textured linear roughening element 1420, such as an emery board, emery stone or grinding tool, to produce a textured surface 1440*a-b* on at least one surface of the conductive ribbon 1410. In such embodiments, at least one of the roughening element 1420 or ribbon 1410 are moved relative to the other under pressure to roughen the surface of the ribbon 1410.

Turning to FIG. 15, in some embodiments, the roughening element 1520 is a laser device configured to laser scan or carve the textured surface 1540*a-c* onto at least one side 1510*a* of the conductive ribbon 1510. In some embodiments, the laser device 1520 is movable in any direction, i.e., forward, back, up, down, side-to-side, etc., relative to the ribbon 1510 which may be stationary. Although depicted on only one side of the ribbon, it is envisioned that laser device may be positioned on multiple sides of the ribbon.

In FIG. 16, the roughing element 1620 does not roughen the surface of ribbon 1610 by removing material. Rather, roughening element 1620 is configured to add material, such as particles or sand, to the surface of the ribbon 1610 to create a textured surface 1640*a-c*. In some embodiments, the roughening element 1620 is a sand blaster capable of moving in any direction, i.e., forward, back, up, down, side-to-side, etc., relative to the ribbon 1610 which may be stationary. Although depicted on only one side of the ribbon, it is envisioned that the sand blaster may be positioned on multiple sides of the ribbon.

The textured surfaces as described herein can create a roughness creating grooves, channels, dimples, crevices, etc. having a depth ranging from 0.01 microns to 1000 microns. In some embodiments, the depth of the roughness may range from about 0.1 microns to 500 microns. In some embodiments, the depth of the roughness may range from about 1 micron to 250 microns. In some embodiments, the depth of the roughness may range from about 10 microns to 100 microns.

The textured surface as described herein can improve the bonding strength or peeling strength between the coated ribbon and the solar cell by a range of 0.1N to 1N. In some embodiments, by a range of 0.2N to 0.5N. In some embodiments, by a range from 0.3N to 0.4N.

In some embodiments, the present disclosure describes a solar module including a plurality of strings of solar cells, each string including an array of shingled strips of solar cells, and at least one electrically conductive bus ribbon connected to the plurality of strings, wherein the at least one electrically conductive bus ribbon includes a color coating on at least a first outer surface of the bus ribbon. The electrically conductive ribbon may soldered to the strings of the solar module and/or may be adhered to the strings of the solar module using known electrically conductive adhesives. In some embodiments, the color coating is on top surface of the ribbon. In some embodiments, the color coating is both the top and opposite bottom surfaces of the ribbon.

In some embodiments, the color coating on the ribbon is a black composition. In some embodiments, the black composition is a black paint. In some embodiments, the black paint is an electrically conductive black paint.

In some embodiments, the color coating is on a central portion of the electrically conductive ribbon, the central portion extending longitudinally along a length of the electrically conductive ribbon with uncoated first and second outer edges extending longitudinally along the length of the electrically conductive ribbon and positioned on either side the central portion.

In some embodiments, at least a second outer surface opposite the first outer surface is free of contaminants after the first surface is colored with the color coating composition.

In some embodiments, the electrically conductive ribbon further includes a plurality of pores.

In some embodiments, the plurality of pores are asymmetrically distributed across the ribbon.

In some embodiments, at least a second outer surface opposite the first outer surface includes a textured surface.

In some embodiments, the textured surface includes a roughness having a depth from about 0.01 to about 1000 microns.

In some embodiments, the textured surface increases the bonding strength between the electrically conductive ribbon and the string of solar cells of from about 0.3N to 0.4N.

In addition to electrically conductive materials, some additional materials which may be frequently attached to the top surfaces of a solar cell or module include for example identification labels. Although not necessarily electrically conductive, identification labels, such as bar codes or QR codes, are often applied to each of the individual solar cells or solar modules to ensure the authenticity of the source of the solar cells or modules. However, these labels are often predominantly white which, like metallic conductive ribbons, can not only stand out aesthetically when placed on a black solar cell or module, but further may provide small areas of shading on the cells or modules.

Accordingly, it would be beneficial both aesthetically and efficiency-wise to provide identification labels which are predominantly not white. For example, in embodiments, the labels may be colored, such as black or blue, to match the solar cell or module and the bar code or QR code information may be printed using a different color coating composition, i.e., ink. For example, in particular embodiments, a black label may be processed as described herein to be coated with a white ink wherein the white ink represents the bar code information and the black label is the background. In such embodiments, the black and white portions of the usual bar code or QR code are reversed rendering most of the label black and a minority of the label white, thereby allowing a majority of the label to blend with the solar cell or module surface.

Another option to obtaining the same label effect may include starting with the normal white labels and applying a black coating as described herein. However, instead of printing the bar code or QR code information in black, the coating may be applied to form an outline or stencil of the bar code or QR code information, i.e., reverse print the code information. In such embodiments, the white label would show through the black outlined coating as the bar code or QR code information. In such embodiments, the black and white portions of the usual bar code or QR code are reversed rendering most of the label black and a minority of the label white, thereby allowing a majority of the label to blend with the solar cell or module surface.

While several embodiments of the disclosure have been shown in the drawings, it is not intended that the disclosure be limited thereto, as it is intended that the disclosure be as broad in scope as the art will allow and that the specification be read likewise. Any combination of the above embodiments is also envisioned and is within the scope of the appended claims. Therefore, the above description should not be construed as limiting, but merely as exemplifications of particular embodiments. Those skilled in the art will envision other modifications within the scope of the claims appended hereto.

What is claimed is:

1. A method comprising:
providing a ribbon holder configured to receive a conductive ribbon for a solar module;
temporarily securing the conductive ribbon in the ribbon holder;
applying a color coating to the conductive ribbon;
curing the color coating on the conductive ribbon; and
separating the conductive ribbon from the ribbon holder, wherein the conductive ribbon is temporarily secured in the ribbon holder with adhesive.

2. The method of claim 1, wherein the adhesive comprises one or more of a hot-melt adhesive, a dissolvable adhesive, a reactive adhesive, a two-part adhesive, a synthetic adhesive, and a bioadhesive.

3. The method of claim 1, wherein the adhesive material includes a pressure sensitive adhesive comprising at least one of an elastomer, a natural rubber, a vinyl ether, an acrylic, a butyl rubber, a styrene block copolymer, a silicone, and a nitrile.

4. The method of claim 1, wherein the separating comprises at least one of peeling, punching, cutting, and using a solvent.

5. The method of claim 1, wherein the ribbon holder includes a single layer of sheet material.

6. The method of claim 1, wherein the ribbon holder includes multiple layers including at least a base sheet including a top surface including the adhesive material and a masking sheet including a bottom surface secured the top surface of the base sheet by the adhesive material.

7. The method of claim 6, wherein the multiple layers of the ribbon holder further includes a protective sheet removably attached on a top surface of the masking sheet.

8. The method of claim 6, wherein the conductive ribbon is secured within a channel of the ribbon holder.

9. The method of claim 8, wherein the channel is formed by removing material.

10. The method of claim 1, wherein the channel is formed by at least one of molding, extruding, and pressing.

11. The method of claim 8, further comprising slicing the conductive ribbon into thinner strips after removing the conductive ribbon from the channel.

12. The method of claim 1, wherein the adhesive removes contaminants from a bottom surface of the conductive ribbon when separating the conductive ribbon from the channel.

13. The method of claim 1, wherein applying the color coating includes at least one of screen-coating, roll-coating, or spray-coating.

14. The method of claim 1, wherein curing the color coating of includes heat-curing or UV curing.

15. The method of claim 1, wherein separating the conductive ribbon occurs prior to curing the color coating.

16. The method of claim 1, further comprising imparting a textured surface to the conductive ribbon by at least one of roughening and adding material.

17. The method of claim 1, wherein the color coating is a black composition.

18. The method of claim 1, wherein the color coating is an electrically conductive paint.

19. The method of claim 1, wherein the color coating is a powder.

* * * * *